US 11,936,355 B2

(12) United States Patent
Matsumoto

(10) Patent No.: US 11,936,355 B2
(45) Date of Patent: Mar. 19, 2024

(54) RADIO FREQUENCY CIRCUIT, RADIO FREQUENCY MODULE, AND COMMUNICATION DEVICE

(71) Applicant: Murata Manufacturing Co., Ltd., Kyoto (JP)

(72) Inventor: Shou Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 231 days.

(21) Appl. No.: 17/452,429

(22) Filed: Oct. 27, 2021

(65) Prior Publication Data

US 2022/0052670 A1 Feb. 17, 2022

Related U.S. Application Data

(63) Continuation of application No. PCT/JP2020/021617, filed on Jun. 1, 2020.

(30) Foreign Application Priority Data

Jun. 10, 2019 (JP) ................................. 2019-108213

(51) Int. Cl.
*H03H 11/02* (2006.01)
*H03F 3/24* (2006.01)
*H04B 1/44* (2006.01)

(52) U.S. Cl.
CPC ............. *H03H 11/02* (2013.01); *H03F 3/245* (2013.01); *H04B 1/44* (2013.01); *H03F 2200/294* (2013.01); *H03F 2200/451* (2013.01)

(58) Field of Classification Search
CPC ........ H03H 11/02; H03H 9/6403; H03H 7/12; H03H 9/64; H03F 3/245; H03F 2200/294; H03F 2200/451; H03F 3/195; H04B 1/44
See application file for complete search history.

(56) References Cited

U.S. PATENT DOCUMENTS 5,878,331 A * 3/1999 Yamamoto ........... H03K 17/693
    333/17.1
7,027,777 B2 * 4/2006 Uriu ...................... H04B 1/406
    455/188.1

(Continued)

FOREIGN PATENT DOCUMENTS

EP    0 993 063 A2    4/2000
JP    2000-114804 A   4/2000
WO   2019/082671 A1   5/2019

OTHER PUBLICATIONS

International Search Report for PCT/JP2020/021617 dated Aug. 25, 2020.
Written Opinion for PCT/JP2020/021617 dated Aug. 25, 2020.

*Primary Examiner* — Dac V Ha
(74) *Attorney, Agent, or Firm* — Pearne & Gordon LLP

(57) ABSTRACT

A filter allows a transmission signal in a predetermined frequency band to pass from a second input-output terminal to a first input-output terminal and allows a reception signal in the predetermined frequency band to pass from the first input-output terminal to the second input-output terminal. A first common terminal of a first switch is connected to the second input-output terminal. A second terminal and a first terminal of the first switch are exclusively connectable to the first common terminal. A second common terminal of a second switch is connected to a ground terminal of the filter. A second selection terminal and a first selection terminal of the second switch are exclusively connected to the second common terminal. Of the first selection terminal and the second selection terminal, only the first selection terminal is connected to a ground with a reactive element interposed therebetween.

16 Claims, 9 Drawing Sheets

(56) References Cited

U.S. PATENT DOCUMENTS

| | | |
|---|---|---|
| 11,476,226 B2 * | 10/2022 | Uejima .................... H03F 3/68 |
| 2004/0067771 A1 | 4/2004 | Wieck |
| 2008/0212283 A1 * | 9/2008 | Chernyakov ........ H05K 1/0207 |
| | | 257/E23.105 |
| 2018/0294858 A1 | 10/2018 | Pehlke |
| 2020/0252042 A1 | 8/2020 | Mori et al. |

\* cited by examiner

RADIO FREQUENCY CIRCUIT, RADIO FREQUENCY MODULE, AND COMMUNICATION DEVICE

CROSS REFERENCE TO RELATED APPLICATION

This is a continuation of International Application No. PCT/JP2020/021617 filed on Jun. 1, 2020 which claims priority from Japanese Patent Application No. 2019-108213 filed on Jun. 10, 2019. The contents of these applications are incorporated herein by reference in their entireties.

BACKGROUND

The present disclosure generally relates to a radio frequency circuit, a radio frequency module, and a communication device, and more specifically, to a radio frequency circuit that includes a filter, a radio frequency module that includes a filter, and a communication device.

A high-band (HB) transceiver module that is known as a radio frequency module that includes a radio frequency circuit includes a power amplifier for time-division duplexing (TDD) communication, a low-noise amplifier for TDD communication, and a TDD filter (for example, see U.S. Patent Application Publication No. 2018/0294858). In U.S. Patent Application Publication No. 2018/0294858, a RF system that includes the HB transceiver module is disclosed.

BRIEF SUMMARY

In some cases of TDD communication, a filter characteristic that is required during transmission differs from a filter characteristic that is required during reception. Accordingly, as for a single filter such as a TDD filter that allows a transmission signal and a reception signal to pass therethrough, adjustment of the attenuation level of the filter characteristic during transmission or the filter characteristic during reception results in degradation of the other filter characteristic in some cases.

The present disclosure to provide a radio frequency circuit, a radio frequency module, and a communication device that can improve both of the filter characteristic during reception and the filter characteristic during transmission in a single filter.

According to embodiments of the present disclosure, a radio frequency circuit includes a filter, a first switch, and a second switch. The filter includes a first input-output terminal, a second input-output terminal, and a ground terminal. The filter allows a transmission signal in a predetermined frequency band to pass from the second input-output terminal to the first input-output terminal and allows a reception signal in the predetermined frequency band to pass from the first input-output terminal to the second input-output terminal. The first switch includes a first common terminal, a first terminal, and a second terminal. The first common terminal is connected to the second input-output terminal. The first terminal and the second terminal are exclusively connectable to the first common terminal. The second switch includes a second common terminal, a first selection terminal, and a second selection terminal. The second common terminal is connected to the ground terminal. The first selection terminal and the second selection terminal are exclusively or simultaneously connected to the second common terminal. Only the first selection terminal or the second selection terminal is connected to a ground with a reactive element interposed therebetween, or the first selection terminal is connected to the ground with a first reactive element interposed therebetween, and the second selection terminal is connected to the ground with a second reactive element that has a reactance value that differs from a reactance value of the first reactive element interposed therebetween.

According to embodiments of the present disclosure, a radio frequency module includes a filter, a first switch, a second switch, a power amplifier, a low-noise amplifier, and a mounting substrate. The filter includes a first input-output terminal, a second input-output terminal, and a ground terminal. The filter allows a transmission signal in a predetermined frequency band to pass from the second input-output terminal to the first input-output terminal and allows a reception signal in the predetermined frequency band to pass from the first input-output terminal to the second input-output terminal. The first switch includes a first common terminal, a first terminal, and a second terminal. The first common terminal is connected to the second input-output terminal. The first terminal and the second terminal are exclusively connectable to the first common terminal. The second switch includes a second common terminal, a first selection terminal, and a second selection terminal. The second common terminal is connected to the ground terminal. The first selection terminal and the second selection terminal are exclusively or simultaneously connected to the second common terminal. The power amplifier is connected to the first terminal. The low-noise amplifier is connected to the second terminal. The mounting substrate has a first main surface and a second main surface that face each other. As for the radio frequency module, only the first selection terminal or the second selection terminal is connected to a ground with a reactive element interposed therebetween, or the first selection terminal is connected to the ground with a first reactive element interposed therebetween, and the second selection terminal is connected to the ground with a second reactive element that has a reactance value that differs from a reactance value of the first reactive element interposed therebetween. The power amplifier is mounted on the first main surface of the mounting substrate. The low-noise amplifier, the first switch, and the second switch are mounted on the second main surface of the mounting substrate.

According to embodiments of the present disclosure, a communication device includes the radio frequency circuit, and a signal processing circuit that performs a signal process on the transmission signal and the reception signal.

According to embodiments of the present disclosure, a communication device includes the radio frequency module, and a signal processing circuit that performs a signal process on the transmission signal and the reception signal.

According to embodiments of the present disclosure, a radio frequency circuit, a radio frequency module, and a communication device can improve both of the filter characteristic during reception and the filter characteristic during transmission in the single filter.

Other features, elements, characteristics and advantages of the present disclosure will become more apparent from the following detailed description of embodiments of the present disclosure with reference to the attached drawings.

DETAILED DESCRIPTION

Figure 4:
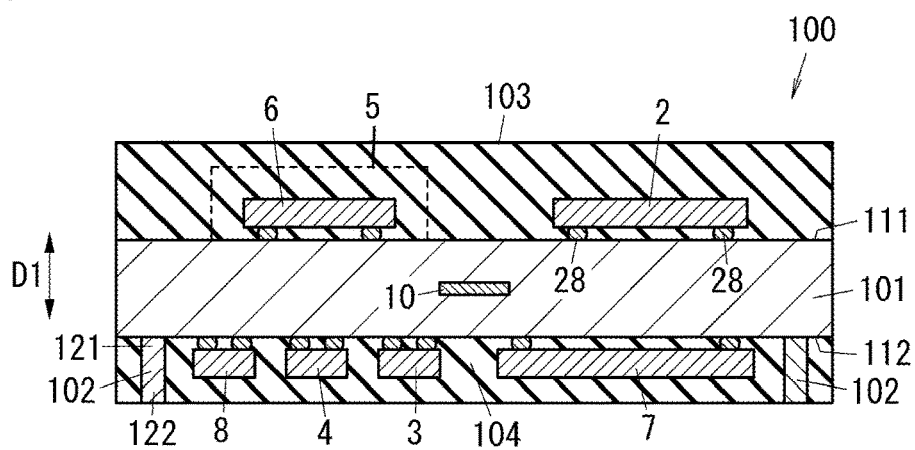
FIG. 4 is a sectional view of a radio frequency module that includes the radio frequency circuit.
Figure 5:
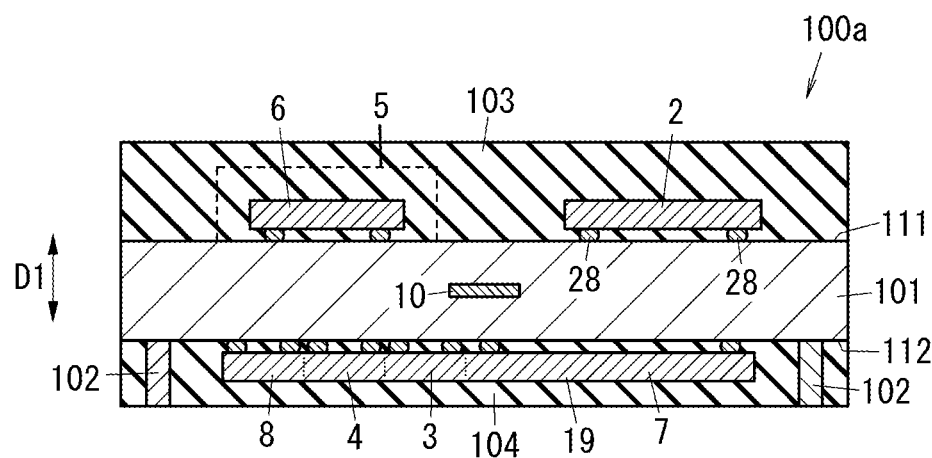
FIG. 5 is a sectional view of a radio frequency module according to a first modification.
Figure 6:
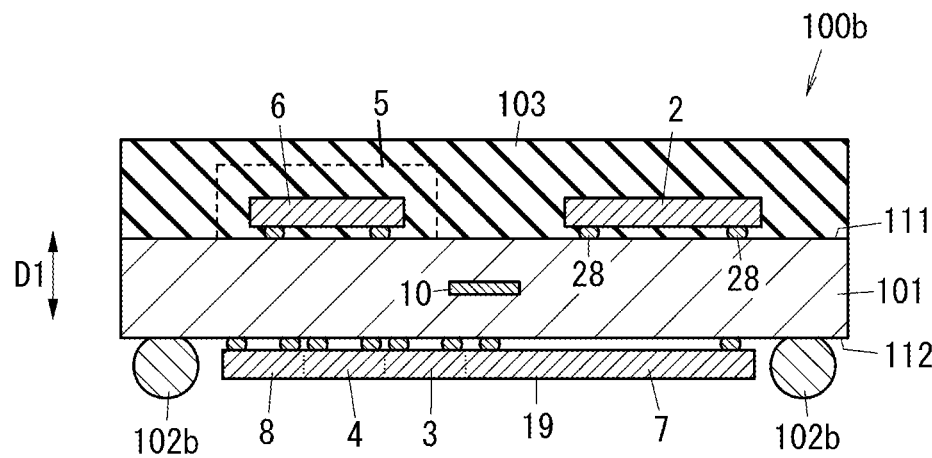
FIG. 6 is a sectional view of a radio frequency module according to a second modification.

FIG. 4 to FIG. 6 referred in description according to, for example, a first embodiment below are schematic views. Actual dimension ratios are not necessarily reflected on ratios of the sizes and thicknesses of components in the figures.

First Embodiment

A radio frequency circuit 1, a radio frequency module 100, and a communication device 300 according to the first embodiment will now be described with reference to FIG. 1 to FIG. 4.

(1) Entire Structure of Radio Frequency Circuit

Figure 1:
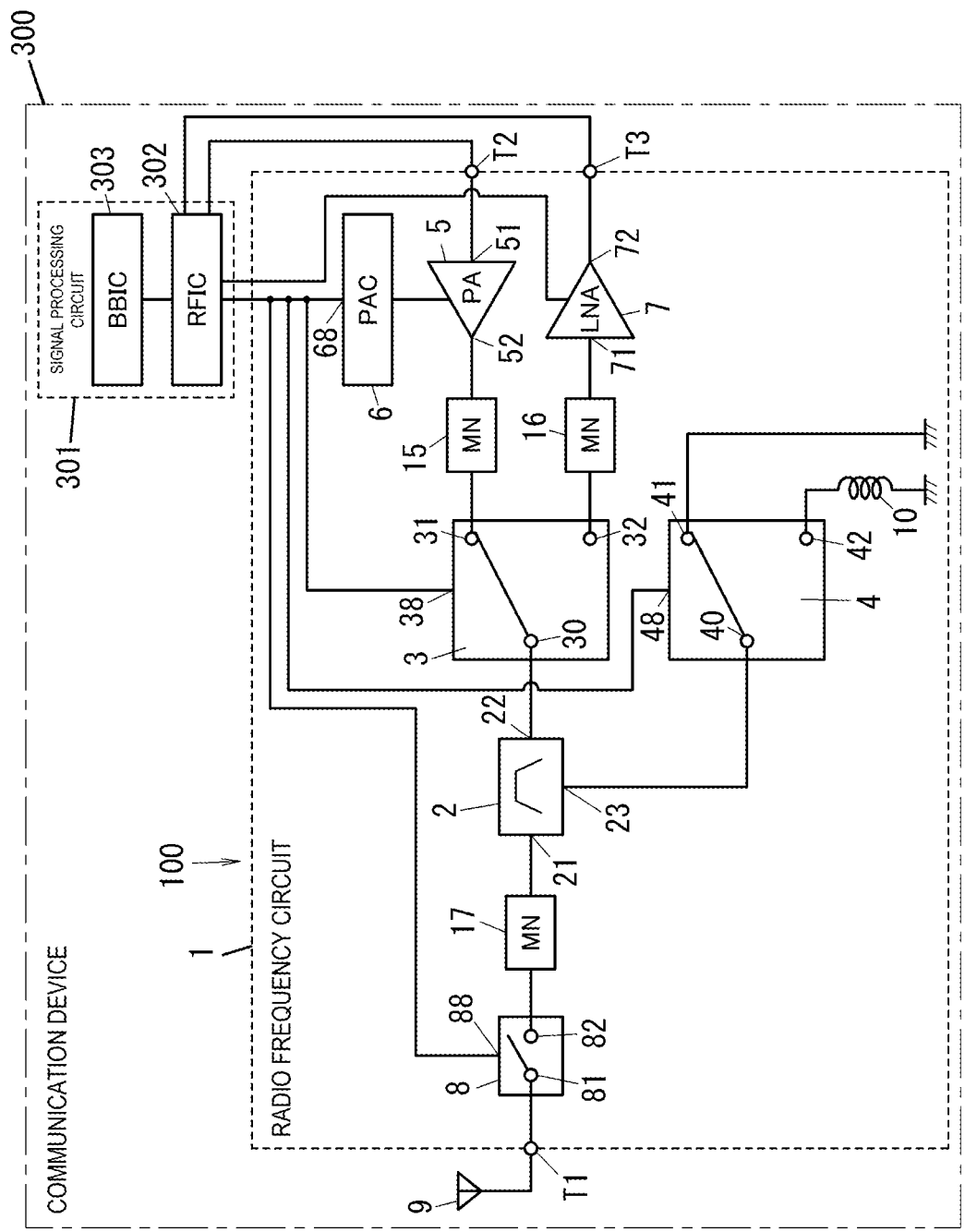
FIG. 1 is a circuit diagram of a communication device that includes a radio frequency circuit according to a first embodiment.

The radio frequency circuit 1 according to the first embodiment will be described with reference to FIG. 1.

The radio frequency circuit 1 according to the first embodiment is used in, for example, the communication device 300. An example of the communication device 300 is a cellular phone (for example, a smart phone) but is not limited thereto and may be, for example, a wearable terminal (for example, a smart watch).

The radio frequency circuit 1 achieves simultaneous transmission and reception of a transmission signal (a transmission radio-frequency signal) in a predetermined frequency band and a reception signal (a reception radio-frequency signal) in the predetermined frequency band in a pseudo manner by using, for example, time division duplex (TDD). The achievement in a pseudo manner described herein means that the transmission of the transmission signal and the reception of the reception signal are not simultaneously performed but are performed in a short time such that the performance is regarded as being simultaneous.

The radio frequency circuit 1 according to the first embodiment includes a filter 2, a first switch 3, and a second switch 4.

The filter 2 conforms to TDD communication. The filter 2 includes a first input-output terminal 21, a second input-output terminal 22, and a ground terminal 23. The filter 2 allows the transmission signal in the predetermined frequency band to pass from the second input-output terminal 22 to the first input-output terminal 21 and allows the reception signal in the predetermined frequency band to pass from the first input-output terminal 21 to the second input-output terminal 22.

The first switch 3 includes a first common terminal 30, a first terminal (a transmission terminal) 31, and a second terminal (a reception terminal) 32. The first common terminal 30 is connected to the second input-output terminal 22 of the filter 2. The first terminal 31 and the second terminal 32 are exclusively connected to the first common terminal 30.

The second switch 4 includes a second common terminal 40, a first selection terminal 41, and a second selection terminal 42. The second common terminal 40 is connected to the ground terminal 23 of the filter 2. The first selection terminal 41 and the second selection terminal 42 are exclusively connected to the second common terminal 40.

As for the radio frequency circuit 1, the first selection terminal 41 is directly connected to the ground, and the second selection terminal 42 is connected to the ground with a reactive element 10 interposed therebetween. The phrase the "first selection terminal 41 is directly connected to the ground" means that the first selection terminal 41 is electrically connected to the ground with only a wiring line interposed therebetween and with no circuit element such as a reactive element interposed therebetween but is not limited thereto and includes the case where the first selection terminal 41 is electrically connected to the ground with neither a circuit element nor a wiring line interposed therebetween.

The radio frequency circuit 1 according to the first embodiment also includes a power amplifier 5 and a power amplifier controller 6. An output terminal 52 of the power amplifier 5 is connected to the first terminal 31 of the first switch 3. The power amplifier controller 6 controls the power amplifier 5.

The radio frequency circuit 1 according to the first embodiment also includes a low-noise amplifier 7. An input terminal 71 of the low-noise amplifier 7 is connected to the second terminal 32 of the first switch 3.

The radio frequency circuit 1 according to the first embodiment also includes a signal input terminal T2, a signal output terminal T3, and an antenna terminal T1.

The signal input terminal T2 is connected to an input terminal 51 of the power amplifier 5. The signal output terminal T3 is connected to an output terminal 72 of the low-noise amplifier 7.

The radio frequency circuit 1 according to the first embodiment also includes a third switch 8. The third switch 8 includes a first terminal 81 and a second terminal 82. The first terminal 81 is connected to the antenna terminal T1. The second terminal 82 is connected to the first common terminal 30 of the first switch 3.

The radio frequency circuit 1 according to the first embodiment also includes an output matching circuit 15, an input matching circuit 16, and a matching circuit 17. The output matching circuit 15 is disposed on a signal path between the power amplifier 5 and the first switch 3. The input matching circuit 16 is disposed on a signal path between the first switch 3 and the low-noise amplifier 7. The matching circuit 17 is disposed on a signal path between the third switch 8 and the filter 2.

The radio frequency circuit 1 is configured such that a transmission signal that is inputted from a signal processing circuit 301 is amplified and can be outputted from the antenna terminal T1 to an antenna 9. The radio frequency circuit 1 is configured such that a reception signal that is inputted from the antenna 9 into the antenna terminal T1 is amplified and can be outputted to the signal processing circuit 301. The signal processing circuit 301 is not a component of the radio frequency circuit 1 but is a component of the communication device 300 that includes the radio frequency circuit 1. The radio frequency circuit 1 according to the first embodiment is controlled by, for example, the signal processing circuit 301 that is included in the communication device 300. The communication device 300 includes the radio frequency circuit 1 and the signal processing circuit 301.

For example, the signal processing circuit 301 includes a RF signal processing circuit 302 and a baseband signal processing circuit 303. The RF signal processing circuit 302 is, for example, a radio frequency integrated circuit (RFIC) and performs a signal process on a radio-frequency signal. For example, the RF signal processing circuit 302 performs a signal process such as up-converting on a radio-frequency signal (a transmission signal) that is outputted from the baseband signal processing circuit 303 and outputs the radio-frequency signal on which the signal process is performed. The baseband signal processing circuit 303 is, for example, a baseband integrated circuit (BBIC) and performs a predetermined signal process on a transmission signal from a location outside the signal processing circuit 301. The reception signal that is processed by the baseband signal processing circuit 303 is used, for example, as an image signal for image display or an audio signal for telecommunication. The radio frequency circuit 1 carries the radio-frequency signals (the reception signal and the transmission signal) between the antenna 9 and the RF signal processing circuit 302 of the signal processing circuit 301. The baseband signal processing circuit 303 is component for the communication device 300.

(2) Components of Radio Frequency Circuit

The components of the radio frequency circuit 1 according to the first embodiment will now be described with reference to the drawings.

(2.1) Filter

The filter 2 allows the transmission signal in the predetermined frequency band to pass from the second input-output terminal 22 to the first input-output terminal 21 and allows the reception signal in the predetermined frequency band to pass from the first input-output terminal 21 to the second input-output terminal 22. The filter 2 conforms to TDD. As for the filter 2, the pass band of the transmission signal overlaps the pass band of the reception signal. The pass band of the transmission signal and the pass band of the reception signal are included in a predetermined frequency band. For example, the predetermined frequency band includes a Band41 communication band or a Band40 communication band. The Band40 communication band that is used for TDD ranges from 2300 MHz to 2400 MHz. The Band41 communication band that is used for TDD ranges from 2496 MHz to 2690 MHz.

Figure 2:
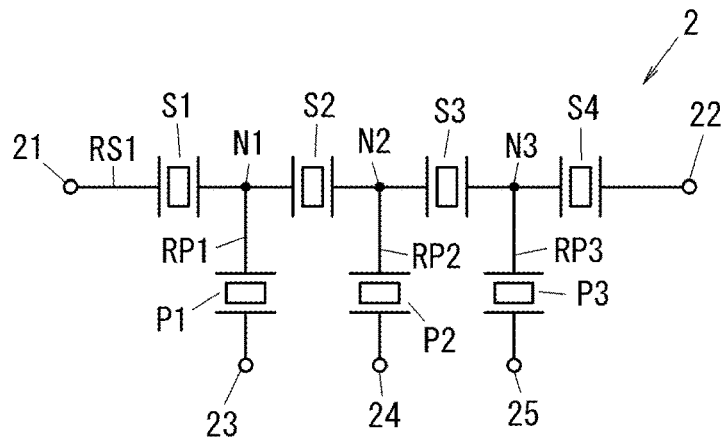
FIG. 2 illustrates a circuit of a filter of the radio frequency circuit.

An example of the filter 2 is a ladder filter as illustrated in FIG. 2. The filter 2 includes multiple (four series arm resonator S in an example illustrated) series arm resonators (a first series arm resonator S1, a second series arm resonator S2, a third series arm resonator S3, and a fourth series arm resonator S4) and multiple (three parallel arm resonators in the example illustrated) parallel arm resonators (a first parallel arm resonator P1, a second parallel arm resonator P2, and a third parallel arm resonator P3) in addition to the first input-output terminal 21, the second input-output terminal 22, and the ground terminal 23 (also referred to below as the first ground terminal 23) described above. The filter 2 also includes a ground terminal 24 (also referred to below as a second ground terminal 24) and a ground terminal 25 (also referred to as a third ground terminal 25).

The multiple series arm resonators are disposed on a path RS1 (also referred to below as a series arm path RS1) between the first input-output terminal 21 and the second input-output terminal 22. The multiple series arm resonators are connected in series on the series arm path RS1. In the filter 2, the multiple series arm resonators are arranged from the first input-output terminal 21 in the order of the first series arm resonator S1, the second series arm resonator S2, the third series arm resonator S3, and the fourth series arm resonator S4.

The first parallel arm resonator P1 is disposed between the series arm path RS1 and the first ground terminal 23. More specifically, the first parallel arm resonator P1 is disposed on a first path RP1 (a first parallel arm path RP1) between the first ground terminal 23 and a first node N1 on the series arm path RS1. The first node N1 is located on the series arm path RS1 between the first series arm resonator S1 and the second series arm resonator S2.

The second parallel arm resonator P2 is disposed between the series arm path RS1 and the second ground terminal 24. More specifically, the second parallel arm resonator P2 is disposed on a second path RP2 (a second parallel arm path RP2) between the second ground terminal 24 and a second node N2 on the series arm path RS1. The second node N2 is located on the series arm path RS1 between the second series arm resonator S2 and the third series arm resonator S3.

The third parallel arm resonator P3 is disposed between the series arm path RS1 and the third ground terminal 25. More specifically, the third parallel arm resonator P3 is disposed on a third path RP3 (a third parallel arm path RP3) between the third ground terminal 25 and a third node N3 on the series arm path R1. The third node N3 is located on the series arm path RS1 between the third series arm resonator S3 and the fourth series arm resonator S4.

An example of the filter 2 is an acoustic wave filter, and the multiple series arm resonators and the multiple parallel arm resonators include respective acoustic wave resonators. An example of the acoustic wave filter is a surface acoustic wave (SAW) filter that uses a surface acoustic wave.

(2.2) First Switch

The first switch 3 includes the first common terminal 30 and two selection terminals (the first terminal 31 and the second terminal 32). The first switch 3 changes a connection state between the first common terminal 30 and the first terminal 31 and between the first common terminal 30 and the second terminal 32. The first switch 3 switches between a first state in which the first common terminal 30 and the first terminal 31 are connected to each other and a second state in which the first common terminal 30 and the second terminal 32 are connected to each other. As for the radio frequency circuit 1, the first terminal 31 and the second terminal 32 of the first switch 3 are exclusively connected to the first common terminal 30 during TDD communication. For example, the first switch 3 can include a single pole double throw (SPDT) switch.

The first common terminal 30 of the first switch 3 is connected to the second input-output terminal 22 of the filter 2. The first terminal 31 of the first switch 3 is connected to the output terminal 52 of the power amplifier 5. Here, the first terminal 31 of the first switch 3 is connected to the output terminal 52 of the power amplifier 5 with the output matching circuit 15 interposed therebetween. The second terminal 32 of the first switch 3 is connected to the input terminal 71 of the low-noise amplifier 7. Here, the second terminal 32 of the first switch 3 is connected to the input terminal 71 of the low-noise amplifier 7 with the input matching circuit 16 interposed therebetween. As for the radio frequency circuit 1, the first switch 3 is capable of switching between a state in which the filter 2 and the power amplifier 5 are electrically connected to each other and a state in which the filter 2 and the low-noise amplifier 7 are electrically connected to each other.

The first switch 3 is controlled by, for example, the signal processing circuit 301. The first switch 3 electrically connects the first common terminal 30 and the first terminal 31 or the second terminal 32 to each other in accordance with a control signal from the RF signal processing circuit 302 of the signal processing circuit 301. The first switch 3 is, for example, a switch integrated circuit (IC) and includes an input unit 38 into which the control signal from the RF signal processing circuit 302 is inputted. For example, the input unit 38 includes multiple terminals that conform to a mobile industry processor interface (MIPI) standard or a single terminal that conforms to general purpose input/output (GPIO).

In the case where the radio frequency circuit 1 transmits the transmission signal, the first common terminal 30 and the first terminal 31 are electrically connected to each other in the first switch 3. In the case where the radio frequency circuit 1 receives the reception signal, the first common terminal 30 and the second terminal 32 are electrically connected to each other in the first switch 3.

(2.3) Second Switch

The second switch 4 includes the second common terminal 40, the first selection terminal 41, and the second selection terminal 42. The second switch 4 changes a connection state between the second common terminal 40 and the first selection terminal 41 and between the second common terminal 40 and the second selection terminal 42. The first selection terminal 41 and the second selection terminal 42 are exclusively connected to the second common terminal 40.

The second common terminal 40 of the second switch 4 is connected to the ground terminal 23 of the filter 2. The first selection terminal 41 of the second switch 4 is directly connected to the ground. The second selection terminal 42 is connected to the ground with the reactive element 10 interposed therebetween. An example of the ground is a circuit ground of the radio frequency circuit 1.

The second switch 4 is controlled by, for example, the signal processing circuit 301. The second switch 4 changes the connection state between the second common terminal 40 and the first selection terminal 41 and between the second common terminal 40 and the second selection terminal 42 in accordance with a control signal from the RF signal processing circuit 302 of the signal processing circuit 301. The second switch 4 is, for example, a switch IC and includes an input unit 48 into which the control signal from the RF signal processing circuit 302 is inputted. For example, the input unit 48 includes multiple terminals that conform to the MIPI standard or a single terminal that conforms to the GPIO.

(2.4) Third Switch

The third switch 8 includes the first terminal 81 and the second terminal 82. The third switch 8 switches between a conducting state in which the first terminal 81 and the second terminal 82 are connected to each other and a non-conducting state in which the first terminal 81 and the second terminal 82 are insulated from each other. An example of the third switch 8 is a single pole single throw (SPST) switch.

The first terminal 81 of the third switch 8 is connected to the antenna terminal T1. The second terminal 82 of the third switch 8 is connected to the first input-output terminal 21 of the filter 2. The antenna 9 is connected to the antenna terminal T1.

The third switch 8 is controlled by, for example, the signal processing circuit 301. The third switch 8 switches between the conducting state and the non-conducting state between the first terminal 81 and the second terminal 82 in accordance with a control signal from the RF signal processing circuit 302 of the signal processing circuit 301. In both cases where the radio frequency circuit 1 transmits the transmission signal and receives the reception signal, as for the third switch 8, the first terminal 81 and the second terminal 82 are connected to each other and are in the conducting state. The third switch 8 is, for example, a switch IC and includes an input unit 88 into which the control signal from the RF signal processing circuit 302 is inputted. For example, the input unit 88 includes multiple terminals that conform to the MIPI standard or a single terminal that conforms to the GPIO.

(2.5) Reactive Element

An end of the reactive element 10 is connected to the second selection terminal 42 of the second switch 4. The other end of the reactive element 10 is connected to the ground.

The reactive element 10 is provided to change the frequency of an attenuation pole of the filter 2, for example, between the case where the second common terminal 40 of the second switch 4 is connected to the first selection terminal 41 and the case where the second common terminal 40 of the second switch 4 is connected to the second selection terminal 42. As for the radio frequency circuit 1 according to the first embodiment, the reactive element 10 is an inductor. The circuit constant (for example, the inductance value) of the reactive element 10 is appropriately determined depending on, for example, the filter characteristic during reception or the filter characteristic during transmission required for the filter 2.

(2.6) Power Amplifier

The power amplifier 5 includes the input terminal 51 and the output terminal 52. The power amplifier 5 amplifies the transmission signal in the predetermined frequency band that is inputted into the input terminal 51 and outputs the signal to the output terminal 52. The input terminal 51 of the power amplifier 5 is connected to the signal input terminal T2. The input terminal 51 of the power amplifier 5 is connected to the signal processing circuit 301 with the signal input terminal T2 interposed therebetween. The signal input terminal T2 is used to input a radio-frequency signal (a transmission signal) from an external circuit (for example, the signal processing circuit 301) into the radio frequency circuit 1. The output terminal 52 of the power amplifier 5 is connected to the first terminal 31 of the first switch 3 with the output matching circuit 15 interposed therebetween. When the radio frequency circuit 1 transmits the transmission signal, the first terminal 31 of the first switch 3 is connected to the first common terminal 30 that is connected to the filter 2. The power amplifier 5 is controlled by the power amplifier controller 6.

(2.7) Output Matching Circuit

The output matching circuit 15 is disposed on a signal path between the output terminal 52 of the power amplifier 5 and the first terminal 31 of the first switch 3. The output matching circuit 15 is used for impedance matching between the power amplifier 5 and the filter 2 that is connected to the first common terminal 30 of the first switch 3. For example, the output matching circuit 15 includes multiple inductors and multiple capacitors but is not limited thereto. In some cases, for example, the output matching circuit 15 includes a single inductor.

(2.8) Power Amplifier Controller

The power amplifier controller 6 controls the power amplifier 5. The power amplifier controller 6 controls the power amplifier 5, for example, based on a control signal from the signal processing circuit 301. The power amplifier controller 6 includes an input unit 68 that is connected to the RF signal processing circuit 302 of the signal processing circuit 301. For example, the input unit 68 receives the control signal from the RF signal processing circuit 302, and the power amplifier controller 6 supplies a bias current to the power amplifier 5 in response to the control signal.

(2.9) Low-Noise Amplifier

The low-noise amplifier 7 includes the input terminal 71 and the output terminal 72. The low-noise amplifier 7 amplifies the reception signal in the predetermined frequency band that passes through the filter 2 and that is inputted into the input terminal 71 and outputs the signal from the output terminal 72. The low-noise amplifier 7 amplifies the reception signal that passes through the filter 2 and outputs the signal. The input terminal 71 of the low-noise amplifier 7 is connected to the second terminal 32 of the first switch 3 with the input matching circuit 16 interposed therebetween. When the radio frequency circuit 1 receives the reception signal, the second terminal 32 of the first switch 3 is connected to the first common terminal 30 that is connected to the filter 2. The output terminal 72 of the low-noise amplifier 7 is connected to the signal output terminal T3. For example, the output terminal 72 of the low-noise amplifier 7 is connected to the signal processing circuit 301 with the signal output terminal T3 interposed therebetween. The signal output terminal T3 is used to output a radio-frequency signal (the reception signal) from the low-noise amplifier 7 to an external circuit (for example, the signal processing circuit 301).

(2.10) Input Matching Circuit

The input matching circuit 16 is disposed on a signal path between the input terminal 71 of the low-noise amplifier 7 and the second terminal 32 of the first switch 3. The input matching circuit 16 is used for impedance matching between the low-noise amplifier 7 and the filter 2 that is connected to the first common terminal 30 of the first switch 3. For example, the input matching circuit 16 includes a single inductor but is not limited thereto. For example, the input matching circuit 16 includes multiple inductors and multiple capacitors in some cases.

(2.11) Matching Circuit

The matching circuit 17 is disposed on a signal path between the second terminal 82 of the third switch 8 and the first input-output terminal 21 of the filter 2. The matching circuit 17 is used for impedance matching between the antenna 9 that is connected to the antenna terminal T1 and the filter 2. For example, the matching circuit 17 includes an inductor or a capacitor that is connected between the ground and a signal path between the second terminal 82 of the third switch 8 and the first input-output terminal 21 of the filter 2 but is not limited thereto. For example, the matching circuit 17 includes multiple inductors and multiple capacitors in some cases.

(3) Filter Characteristic of Filter of Radio Frequency Circuit

Figure 3:
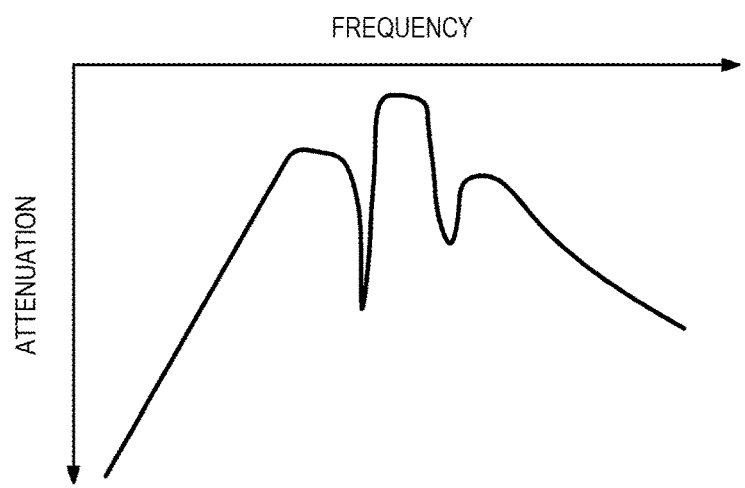
FIG. 3 illustrates a filter characteristic of the filter of the radio frequency circuit.

In the case where the second common terminal 40 of the second switch 4 is connected to the first selection terminal 41, the radio frequency circuit 1 has a filter characteristic illustrated in, for example, FIG. 3. The horizontal axis in FIG. 3 represents frequency. The vertical axis in FIG. 3 represents attenuation. As for the radio frequency circuit 1, for example, in the case where a state in which the first selection terminal 41 and the second common terminal 40 of the second switch 4 are connected to each other is changed into a state in which the second common terminal 40 and the second selection terminal 42 are connected to each other in the second switch 4, a lower-limit frequency attenuation pole in the pass band in the filter characteristic in FIG. 3 shifts to the location of a decreased frequency. As for the radio frequency circuit 1, for example, in some cases where the state in which the first selection terminal 41 and the second common terminal 40 of the second switch 4 are connected to each other is changed into the state in which the second common terminal 40 and the second selection terminal 42 are connected to each other in the second switch 4, an upper-limit frequency attenuation pole in the pass band in the filter characteristic shifts to the location of an increased frequency depending on the design of the filter 2.

When the radio frequency circuit 1 receives the reception signal, the filter 2 allows the reception signal to pass therethrough with the second common terminal 40 of the second switch 4 connected to the first selection terminal 41. When the radio frequency circuit 1 transmits the transmission signal by using a path that passes through the filter 2, the filter 2 allows the transmission signal to pass therethrough with the second common terminal 40 of the second switch 4 connected to the second selection terminal 42. Accordingly, the radio frequency circuit 1 can improve both of the filter characteristic that is required when the reception signal is received and the filter characteristic that is required when the transmission signal is transmitted. As for the radio frequency circuit 1, when the connection state of the first switch 3 is changed, the connection state of the second switch 4 is changed depending on the changed connection state of the first switch 3. As for the radio frequency circuit 1, when the first switch 3 is operated, the second switch 4 is operated such that a relationship between the connection state of the first switch 3 and the connection state of the second switch 4 satisfies a predetermined condition.

(4) Radio Frequency Module

The radio frequency module 100 according to the first embodiment will now be described with reference to FIG. 1 and FIG. 4.

The radio frequency module 100 according to the first embodiment includes the radio frequency circuit 1. Accordingly, the radio frequency module 100 includes the filter 2, the first switch 3, the second switch 4, the power amplifier 5, and the low-noise amplifier 7 described above. The radio frequency module 100 also includes a mounting substrate 101.

The mounting substrate 101 has a first main surface 111 and a second main surface 112 that face each other in the thickness direction D1 of the mounting substrate 101. As for the radio frequency module 100, the power amplifier 5 is mounted on the first main surface 111 of the mounting substrate 101. As for the radio frequency module 100, the low-noise amplifier 7, the first switch 3, and the second switch 4 are mounted on the second main surface 112 of the mounting substrate 101.

The radio frequency module 100 according to the first embodiment also includes a first resin layer 103 that covers an electronic component on the first main surface 111 of the mounting substrate 101, such as the power amplifier 5 that is mounted on the first main surface 111 of the mounting substrate 101. The radio frequency module 100 also includes a second resin layer 104 that covers electronic components on the second main surface 112 of the mounting substrate 101, such as the first switch 3, the second switch 4, the third switch 8, and the low-noise amplifier 7 that are mounted on the second main surface 112 of the mounting substrate 101. The second resin layer 104 is not limited to the case where a back surface of the substrate is covered at the first switch 3, the second switch 4, the third switch 8, and the low-noise amplifier 7. For example, the back surface of the substrate may be exposed at the first switch 3, the second switch 4, the third switch 8, and the low-noise amplifier 7. The material of the second resin layer 104 may be the same as the material of the first resin layer 103 or may differ therefrom.

The radio frequency module 100 will now be described in more detail.

The radio frequency module 100 includes multiple circuit elements, such as the power amplifier controller 6, the third switch 8, the output matching circuit 15, the input matching circuit 16, and the matching circuit 17 in addition to the filter 2, the first switch 3, the second switch 4, the power amplifier 5, and the low-noise amplifier 7 described above. The multiple circuit elements of the radio frequency module 100 are disposed on the mounting substrate 101. Each of the multiple circuit elements is not limited to an electronic component that is mounted on the mounting substrate 101 but may include a circuit element that is included in the mounting substrate 101.

The radio frequency module 100 also includes multiple outer connection electrodes 102. Here, the multiple outer connection electrodes 102 include the antenna terminal T1, the signal input terminal T2, the signal output terminal T3, and the multiple ground electrodes. In FIG. 4, only two outer connection electrodes 102 of the multiple outer connection electrodes 102 are illustrated. The multiple outer connection electrodes 102 are substantially columnar (for example, substantially cylindrical) electrodes that are disposed on the second main surface 112 of the mounting substrate 101. Examples of the material of the multiple outer connection electrodes 102 include metal (for example, copper, copper alloy). Each of the multiple outer connection electrodes 102 includes a base end portion 121 that is joined to the second main surface 112 of the mounting substrate 101 in the thickness direction D1 of the mounting substrate 101 and an end portion 122 opposite the base end portion 121. For example, the end portion 122 of each of the multiple outer connection electrodes 102 may include a gold plating layer.

For example, the multiple outer connection electrodes 102 include first-group outer connection electrodes 102 that are disposed along the outer circumference of the second main surface 112 of the mounting substrate 101, and second-group outer connection electrodes 102 that are disposed inside the first-group outer connection electrodes 102. For example, in the perspective of improvement in the mounting ability of the radio frequency module 100 on a mother substrate on which the radio frequency module 100 is mounted and increase in the number of the ground electrodes of the radio frequency module 100, the radio frequency module 100 preferably includes at least the first-group outer connection electrodes 102 among the first-group outer connection electrodes 102 and the second-group outer connection electrodes 102.

The filter 2 is a one-chip filter. As for the filter 2 here, for example, the multiple series arm resonators and the multiple parallel arm resonators include the respective acoustic wave resonators. In this case, for example, the filter 2 includes a substrate that has a front surface (a first main surface) and a back surface (a second main surface) that face each other, a low acoustic velocity film that is disposed above the first main surface of the substrate, a piezoelectric layer that is disposed above the low acoustic velocity film, multiple first interdigital transducer (IDT) electrodes that are disposed on the piezoelectric layer and that are associated with the multiple series arm resonators in a one-to-one manner, and multiple second IDT electrodes that are associated with the multiple parallel arm resonators in a one-to-one manner. Here, the low acoustic velocity film is directly disposed on the substrate or indirectly disposed. The piezoelectric layer is directly disposed on the low acoustic velocity film or indirectly disposed. The acoustic velocity of a bulk wave that propagates through the low acoustic velocity film is lower than the acoustic velocity of an acoustic wave that propagates through the piezoelectric layer. The acoustic velocity of a bulk wave that propagates through the substrate is higher than the acoustic velocity of an acoustic wave that propagates through the piezoelectric layer. An example of the material of the piezoelectric layer is lithium tantalate. An example of the material of the low acoustic velocity film is silicon oxide. An example of the substrate is a silicon substrate. For example, the thickness of the piezoelectric layer is $3.5\lambda$ or less where $\lambda$ is the wavelength of the acoustic wave that is determined by using the electrode finger period of the first IDT electrodes and the second IDT electrodes. For example, the thickness of the low acoustic velocity film is $2.0\lambda$ or less.

The piezoelectric layer is composed of, for example, lithium tantalate, lithium niobate, zinc oxide, aluminum nitride, or PZT. The low acoustic velocity film contains at least one kind of a material selected from the group consisting of silicon oxide, glass, silicon oxynitride, tantalum oxide, or a compound obtained by adding fluorine, carbon, or boron into silicon oxide. The substrate contains at least one kind of a material selected from the group consisting of silicon, aluminum nitride, aluminum oxide, silicon carbide, silicon nitride, sapphire, lithium tantalate, lithium niobate, crystal, alumina, zirconia, cordierite, mullite, steatite, forsterite, magnesia, and diamond.

For example, the filter 2 also includes a spacer layer and a covering member. The spacer layer and the covering member are disposed near the first main surface of the substrate. The spacer layer surrounds the multiple first IDT electrodes and the multiple second IDT electrodes in a plan view in the thickness direction of the substrate. The spacer layer has a substantially frame shape (a substantially rectangular frame shape) in a plan view in the thickness direction of the substrate. The spacer layer has an electrical insulation characteristic. An example of the material of the spacer layer is synthetic resin, such as epoxy resin or polyimide. The covering member has a substantially flat plate shape. The covering member has a substantially rectangular shape in a plan view in the thickness direction of the substrate but is not limited thereto and may have, for example, a substantially square shape. As for the filter 2, the size of the external form of the covering member, the size of the external form of the spacer layer, and the size of the external form of the substrate are substantially equal to each other in a plan view in the thickness direction of the substrate. The covering member is disposed on the spacer layer so as to face the substrate in the thickness direction of the substrate. The covering member overlaps the multiple first IDT electrodes and the multiple second IDT electrodes in the thickness direction of the substrate and is separated from the multiple first IDT electrodes and the multiple second IDT electrodes in the thickness direction of the substrate. The covering member has the electrical insulation characteristic. An example of the material of the covering member is synthetic resin, such as epoxy resin or polyimide. The filter 2 has a space that is surrounded by the substrate, the spacer layer, and the covering member. There is gas in the space of the filter 2. Examples of the gas include air and inert gas (for example, nitrogen gas). Multiple terminals 28 that include the first input-output terminal 21, the second input-output terminal 22, and the multiple ground terminals 23 to 25 are exposed from the covering member. An example of each of the multiple terminals 28 is a bump. An example of the bump is solder bump. The bump is not limited to the solder bump and may be, for example, a gold bump.

The filter 2 is mounted on the first main surface 111 of the mounting substrate 101. The filter 2 is disposed such that, of the second main surface and the first main surface of the substrate, the first main surface faces the mounting substrate 101. The outer circumferential shape of the filter 2 is a substantially quadrilateral shape in a plan view in the thickness direction D1 of the mounting substrate 101. The filter 2 is not limited to the case where the filter 2 is mounted on the first main surface 111 of the mounting substrate 101 and may be mounted, for example, on the second main surface 112.

For example, the filter 2 may include a close-contact layer that is interposed between the low acoustic velocity film and the piezoelectric layer. The close-contact layer is composed of, for example, resin (epoxy resin or polyimide resin). The filter 2 may include a dielectric film between the low acoustic velocity film and the piezoelectric layer, above the piezoelectric layer, or below the low acoustic velocity film.

For example, the filter 2 may include a high acoustic velocity film that is interposed between the substrate and the low acoustic velocity film. Here, the high acoustic velocity film is directly disposed on the substrate or indirectly disposed. The low acoustic velocity film is directly disposed on the high acoustic velocity film or indirectly disposed. The piezoelectric layer is directly disposed on the low acoustic velocity film or indirectly disposed. The acoustic velocity of a bulk wave that propagates through the high acoustic velocity film is higher than the acoustic velocity of an acoustic wave that propagates through the piezoelectric layer. The acoustic velocity of a bulk wave that propagates through the low acoustic velocity film is lower than the acoustic velocity of an acoustic wave that propagates through the piezoelectric layer.

The high acoustic velocity film is composed of a piezoelectric material, such as diamond-like carbon, aluminum nitride, aluminum oxide, silicon carbide, silicon nitride, silicon, sapphire, lithium tantalate, lithium niobate, or crystal, ceramics, such as alumina, zirconia, cordierite, mullite, steatite, or forsterite, magnesia, diamond, a material that contains any one of the materials described above as a main component, or a material that contains a mixture of the materials described above as a main component.

As for the thickness of the high acoustic velocity film, the thickness of the high acoustic velocity film is preferably increased as much as possible because the high acoustic velocity film has a function of confining an acoustic wave in the piezoelectric layer and the low acoustic velocity film. For example, the piezoelectric substrate may include a close-contact layer or a dielectric film as another film other than the high acoustic velocity film, the low acoustic velocity film, and the piezoelectric layer.

The multiple series arm resonators and the multiple parallel arm resonators are not limited to the acoustic wave resonators described above and may be, for example, surface acoustic wave (SAW) resonators or bulk acoustic wave (BAW) resonators. Here, for example, each of the SAW resonators includes a piezoelectric substrate and an IDT electrode that is disposed on the piezoelectric substrate. In the case where the multiple series arm resonators and the multiple parallel arm resonators include the respective SAW resonators, the filter 2 includes, on the single piezoelectric substrate, the multiple IDT electrodes that are associated with the multiple series arm resonators in a one-to-one manner and the multiple IDT electrodes that are associated with the multiple parallel arm resonators in a one-to-one manner. Examples of the piezoelectric substrate include a lithium tantalate substrate and a lithium niobate substrate.

The first switch 3, the second switch 4, and the third switch 8 are switch ICs. More specifically, the first switch 3, the second switch 4, and the third switch 8 are one-chip IC chips each of which includes, for example, a substrate that has a front surface (a first main surface) and a back surface (a second main surface) that face each other and a switch functional unit that includes a field effect transistor (FET) that is formed near the first main surface of the substrate. An example of the substrate is a silicon substrate. The switch functional unit has a function of changing the connection state. The first switch 3, the second switch 4, and the third switch 8 are mounted on the second main surface 112 of the mounting substrate 101 by flip chip mounting such that, of the second main surface and the first main surface of the substrate, the first main surface faces the second main surface 112 of the mounting substrate 101. The shapes of the outer circumferences of the first switch 3, the second switch 4, and the third switch 8 are substantially quadrilateral shapes in a plan view in the thickness direction D1 of the mounting substrate 101.

An example of the power amplifier 5 is a one-chip IC chip that includes a substrate that has a front surface (a first main surface) and a back surface (a second main surface) that face each other and a functional amplification unit that includes at least a transistor that is formed near the first main surface of the substrate. An example of the substrate is a gallium arsenide substrate. The functional amplification unit is a functional unit that has a function of amplifying the transmission signal in the predetermined frequency band. An example of the transistor is a heterojunction bipolar transistor (HBT). The bias current from the power amplifier controller 6 is supplied to the power amplifier 5. For example, the power amplifier 5 may include a capacitor for cutting current in addition to the functional amplification unit. The power amplifier 5 is mounted on the first main surface 111 of the mounting substrate 101 by flip chip mounting such that, of the second main surface and the first main surface of the substrate, the first main surface faces the first main surface 111 of the mounting substrate 101. The shape of the outer circumference of the power amplifier 5 is a substantially quadrilateral shape in a plan view in the thickness direction D1 of the mounting substrate 101.

An example of the power amplifier controller 6 is a one-chip IC chip that includes a substrate that has a front surface (a first main surface) and a back surface (a second main surface) that face each other and a functional control unit that is formed near the first main surface of the substrate. An example of the substrate is a silicon substrate. The functional control unit is a functional unit that has a function of controlling the power amplifier 5. The power amplifier controller 6 is mounted on the first main surface 111 of the mounting substrate 101 by flip chip mounting such that, of the second main surface and the first main surface of the substrate, the first main surface faces the first main surface 111 of the mounting substrate 101. The shape of the outer circumference of the power amplifier controller 6 is a substantially quadrilateral shape in a plan view in the thickness direction D1 of the mounting substrate 101.

An example of the low-noise amplifier 7 is a one-chip IC chip that includes a substrate that has a front surface (a first main surface) and a back surface (a second main surface) that face each other and a functional amplification unit that is formed near the first main surface of the substrate. An example of the substrate is a silicon substrate. The functional amplification unit is a functional unit that has a function of amplifying the reception signal in the predetermined frequency band. The low-noise amplifier 7 is mounted on the second main surface 112 of the mounting substrate 101 by flip chip mounting such that, of the second main surface and the first main surface of the substrate, the first main surface faces the second main surface 112 of the mounting substrate 101. The shape of the outer circumference of the low-noise amplifier 7 is a substantially quadrilateral shape in a plan view in the thickness direction D1 of the mounting substrate 101.

An example of each of the multiple inductors of the output matching circuit 15 is a chip inductor. The multiple inductors of the output matching circuit 15 are mounted, for example, on the first main surface 111 of the mounting substrate 101 but are not limited thereto. An example of each of the multiple capacitors of the output matching circuit 15 is a chip capacitor. The multiple capacitors of the output matching circuit 15 are mounted, for example, on the first main surface 111 of the mounting substrate 101 but are not limited thereto. An example of the output matching circuit 15 may be a one-chip integrated passive device (IPD) that includes a substrate that has a front surface (a first main surface) and a back surface (a second main surface) that face each other and multiple capacitors and multiple inductors that are formed near the first main surface of the substrate. An example of the substrate is a silicon substrate. In the case of the IPD, for example, the output matching circuit 15 is mounted on the first main surface 111 of the mounting substrate 101 by flip chip mounting such that, of the second main surface and the first main surface of the substrate, the first main surface faces the first main surface 111 of the mounting substrate 101.

An example of the inductor of the input matching circuit 16 is a chip inductor. The inductor of the input matching circuit 16 is mounted, for example, on the first main surface 111 of the mounting substrate 101 but is not limited thereto.

Examples of the mounting substrate 101 include a printed circuit board and a low temperature co-fired ceramics (LTCC) substrate. Here, an example of the mounting substrate 101 is a multilayer substrate that includes multiple dielectric layers and multiple conductive pattern layers. The multiple dielectric layers and the multiple conductive pattern layers are stacked in the thickness direction D1 of the mounting substrate 101. The multiple conductive pattern layers are formed into a predetermined pattern. Each of the multiple conductive pattern layers includes a single or multiple conductive portions on a plane perpendicular to the thickness direction D1 of the mounting substrate 101. An example of the material of each of the conductive pattern layers is copper.

The second main surface 112 and the first main surface 111 of the mounting substrate 101 are separated from each other in the thickness direction D1 of the mounting substrate 101 and intersect the thickness direction D1 of the mounting substrate 101. For example, the first main surface 111 of the mounting substrate 101 is perpendicular to the thickness direction D1 of the mounting substrate 101. For example, surfaces that are not perpendicular to the thickness direction D1 may include a side surface of the conductive portion. For example, the second main surface 112 of the mounting substrate 101 is perpendicular to the thickness direction D1 of the mounting substrate 101. For example, the surfaces that are not perpendicular to the thickness direction D1 may include a side surface of the conductive portion. The second main surface 112 and the first main surface 111 of the mounting substrate 101 may have fine unevenness, a depressed portion, or a projecting portion.

The reactive element 10 is an inner-layer inductor that is disposed in the mounting substrate 101 but is not limited thereto and may be, for example, a chip inductor that is mounted on the first main surface 111 of the mounting substrate 101.

(5) Summary (5.1) Radio Frequency Circuit

The radio frequency circuit 1 according to the first embodiment includes the filter 2, the first switch 3, and the second switch 4. The filter 2 includes the first input-output terminal 21, the second input-output terminal 22, and the ground terminal 23. The filter 2 allows the transmission signal in the predetermined frequency band to pass from the second input-output terminal 22 to the first input-output terminal 21 and allows the reception signal in the predetermined frequency band to pass from the first input-output terminal 21 to the second input-output terminal 22. The first switch 3 includes the first common terminal 30, the first terminal 31, and second terminal 32. The first common terminal 30 is connected to the second input-output terminal 22. The first terminal 31 and the second terminal 32 are exclusively connectable to the first common terminal 30. The second switch 4 includes the second common terminal 40, the first selection terminal 41, and the second selection terminal 42. The second common terminal 40 is connected to the ground terminal 23. The first selection terminal 41 and the second selection terminal 42 are exclusively connected to the second common terminal 40. Of the first selection terminal 41 and the second selection terminal 42, only the second selection terminal 42 is connected to the ground with the reactive element 10 interposed therebetween, and the first selection terminal 41 is directly connected to the ground.

The radio frequency circuit 1 according to the first embodiment can improve both of the filter characteristic during reception and the filter characteristic during transmission in the single filter 2. In short, the radio frequency circuit 1 according to the first embodiment can improve both of the filter characteristic during reception and the filter characteristic during transmission in the filter 2 for TDD communication in which the reception signal and the transmission signal in the predetermined frequency band are allowed to pass.

(5.2) Radio Frequency Module

The radio frequency module 100 according to the first embodiment includes the filter 2, the first switch 3, the second switch 4, the power amplifier 5, the low-noise amplifier 7, and the mounting substrate 101. The filter 2 includes the first input-output terminal 21, the second input-output terminal 22, and the ground terminal 23. The filter 2 allows the transmission signal in the predetermined frequency band to pass from the second input-output terminal 22 to the first input-output terminal 21 and allows the reception signal in the predetermined frequency band to pass from the first input-output terminal 21 to the second input-output terminal 22. The first switch 3 includes the first common terminal 30, the first terminal 31, and the second terminal 32. The first common terminal 30 is connected to the second input-output terminal 22. The first terminal 31 and the second terminal 32 are exclusively connectable to the first common terminal 30. The second switch 4 includes the second common terminal 40, the first selection terminal 41, and the second selection terminal 42. The second common terminal 40 is connected to the ground terminal 23. The first selection terminal 41 and the second selection terminal 42 are exclusively connected to the second common terminal 40. The power amplifier 5 is connected to the first terminal 31. The low-noise amplifier 7 is connected to the second terminal 32. The mounting substrate 101 has the first main surface 111 and the second main surface 112 that face each other. As for the radio frequency module 100, of the first selection terminal 41 and the second selection terminal 42, only the second selection terminal 42 is connected to the ground with the reactive element 10 interposed therebetween, and the first selection terminal 41 is directly connected to the ground. The power amplifier 5 is mounted on the first main surface 111 of the mounting substrate 101. The low-noise amplifier 7, the first switch 3, and the second switch 4 are mounted on the second main surface 112 of the mounting substrate 101.

The radio frequency module 100 according to the first embodiment can improve both of the filter characteristic during reception and the filter characteristic during transmission in the single filter 2. In short, the radio frequency module 100 according to the first embodiment can improve both of the filter characteristic during reception and the filter characteristic during transmission in the filter 2 for TDD communication in which the reception signal and the transmission signal in the predetermined frequency band are allowed to pass.

As for the radio frequency module 100 according to the first embodiment, the power amplifier 5 and the low-noise amplifier 7 do not overlap in a plan view in the thickness direction D1 of the mounting substrate 101. This enables isolation between the power amplifier 5 and the low-noise amplifier 7 to be improved. The radio frequency module 100 according to the first embodiment can further improve the isolation between the power amplifier 5 and the low-noise amplifier 7 in a manner in which the mounting substrate 101 includes a ground layer that is located between the power amplifier 5 and the low-noise amplifier 7.

(5.3) Communication Device

The communication device 300 according to the first embodiment includes the radio frequency circuit 1 and the signal processing circuit 301 that performs the signal process on the transmission signal that is transmitted by the radio frequency circuit 1 and the reception signal that is received by the radio frequency circuit 1. Here, the communication device 300 according to the first embodiment also includes the antenna 9.

The communication device 300 according to the first embodiment includes the radio frequency module 100 and the signal processing circuit 301 that performs the signal process on the transmission signal that is transmitted by the radio frequency circuit 1 and the reception signal that is received by the radio frequency circuit 1. Here, the communication device 300 according to the first embodiment also includes the antenna 9.

The communication device 300 according to the first embodiment can improve both of the filter characteristic during reception and the filter characteristic during transmission in the single filter 2. In short, the communication device 300 according to the first embodiment can improve both of the filter characteristic during reception and the filter characteristic during transmission in the filter 2 for TDD communication in which the reception signal and the transmission signal in the predetermined frequency band are allowed to pass.

(6) Modification to Radio Frequency Module

A radio frequency module 100a according to a first modification to the first embodiment will be described with reference to FIG. 5. Regarding the radio frequency module 100a according to the first modification, components like to those of the radio frequency module 100 according to the first embodiment are designated by like reference characters, and a description thereof is omitted.

As for the radio frequency module 100a according to the first modification, a one-chip IC chip (a semiconductor chip) 19 that includes the low-noise amplifier 7, the first switch 3, and the second switch 4 is mounted on the second main surface 112 of the mounting substrate 101. This enables the radio frequency module 100a according to the first modification to decrease the size of the mounting substrate 101 to a size smaller than that of the radio frequency module 100 according to the first embodiment. The radio frequency module 100a according to the first modification can reduce the loss of a wiring line to a loss smaller than the loss of that of the radio frequency module 100 according to the first embodiment.

As for the radio frequency module 100a according to the first modification, the IC chip 19 also includes the third switch 8. This enables the radio frequency module 100a according to the first modification to decrease the size of the mounting substrate 101 to a size smaller than that of the radio frequency module 100 according to the first embodiment.

A radio frequency module 100b according to a second modification to the first embodiment will be described with reference to FIG. 6. Regarding the radio frequency module 100b according to the second modification, components like to those of the radio frequency module 100a according to the first modification are designated by like reference characters, and a description thereof is omitted.

The radio frequency module 100b according to the second modification differs from the radio frequency module 100a according to the first modification in that multiple outer connection electrodes 102b are included instead of the multiple outer connection electrodes 102 of the radio frequency module 100a according to the first modification. The radio frequency module 100b according to the second modification differs from the radio frequency module 100a according to the first modification in that the second resin layer 104 of the radio frequency module 100a according to the first modification is not included. The radio frequency module 100b according to the second modification preferably includes an underfill portion that is disposed in a gap between the IC chip 19 and the second main surface 112 of the mounting substrate 101.

Each of the multiple outer connection electrodes 102b is a ball bump. Examples of the material of the ball bump include gold, copper, and solder.

Second Embodiment

Figure 7:
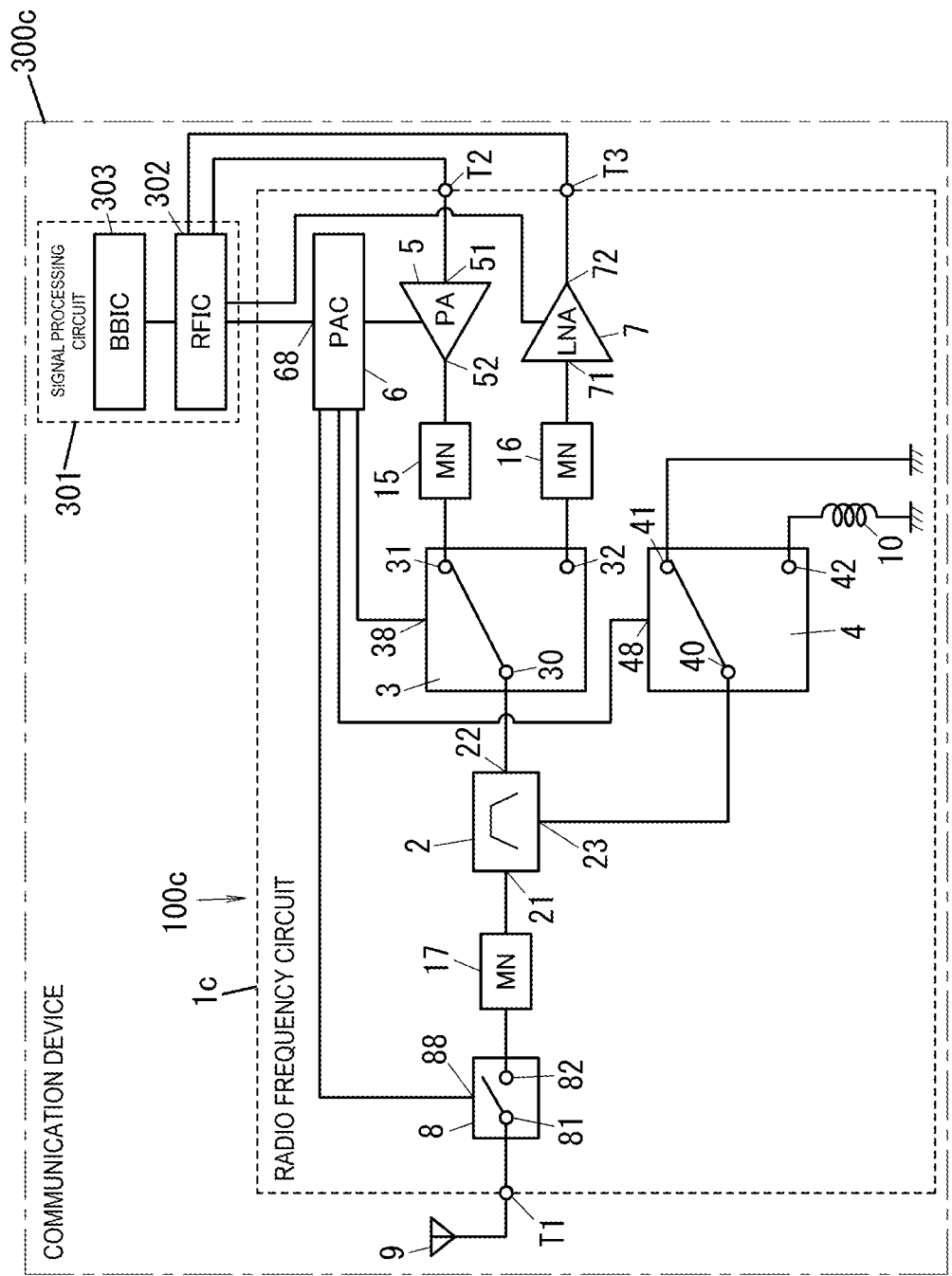
FIG. 7 is a circuit diagram of a communication device that includes a radio frequency circuit according to a second embodiment.

A radio frequency circuit 1c, a radio frequency module 100c, and a communication device 300c according to a second embodiment will now be described with reference to FIG. 7. Regarding the radio frequency circuit 1c, the radio frequency module 100c, and the communication device 300c according to the second embodiment, components like to those of the radio frequency circuit 1, the radio frequency module 100, and the communication device 300 according to the first embodiment are designated by like reference characters, and a description thereof is omitted.

The radio frequency circuit 1c according to the second embodiment differs from the radio frequency circuit 1 according to the first embodiment in that the first switch 3, the second switch 4, and the third switch 8 are controlled by the power amplifier controller 6.

As for the radio frequency circuit 1c according to the second embodiment, the power amplifier controller 6 is connected to the input units 38, 48, and 88 of the first switch 3, the second switch 4, and the third switch 8. Here, the power amplifier controller 6 controls the power amplifier 5, the first switch 3, the second switch 4, and the third switch 8 in accordance with a control signal from the RF signal processing circuit 302. The input unit 68 of the power amplifier controller 6 that is connected to the RF signal processing circuit 302 conforms to, for example, the MIPI standard. The power amplifier controller 6 provides the second switch 4 with a control signal for changing the connection state of the second switch 4, based on control information that is included in the control signal from the RF signal processing circuit 302 that is inputted into the input unit 68. The power amplifier controller 6 provides the first switch 3 with a control signal for changing the connection state of the first switch 3, based on the control information that is included in the control signal from the RF signal processing circuit 302 that is inputted into the input unit 68. The power amplifier controller 6 provides the third switch 8 with a control signal for changing the connection state of the third switch 8, based on the control information that is included in the control signal from the RF signal processing circuit 302 that is inputted into the input unit 68.

The radio frequency circuit 1c according to the second embodiment can improve both of the filter characteristic during reception and the filter characteristic during transmission in the single filter 2 as in the radio frequency circuit 1 according to the first embodiment.

The radio frequency module 100c according to the second embodiment includes the radio frequency circuit 1c. The radio frequency module 100c according to the second embodiment can improve both of the filter characteristic during reception and the filter characteristic during transmission in the single filter 2 as in the radio frequency module 100 according to the first embodiment.

The communication device 300c according to the second embodiment includes the radio frequency circuit 1c and the signal processing circuit 301. The communication device 300c according to the second embodiment can improve both of the filter characteristic during reception and the filter characteristic during transmission in the single filter 2 as in the communication device 300 according to the first embodiment.

The communication device 300c according to the second embodiment includes the radio frequency module 100c and the signal processing circuit 301. The communication device 300c according to the second embodiment can improve both of the filter characteristic during reception and the filter characteristic during transmission in the single filter 2 as in the communication device 300 according to the first embodiment.

Third Embodiment

Figure 8:
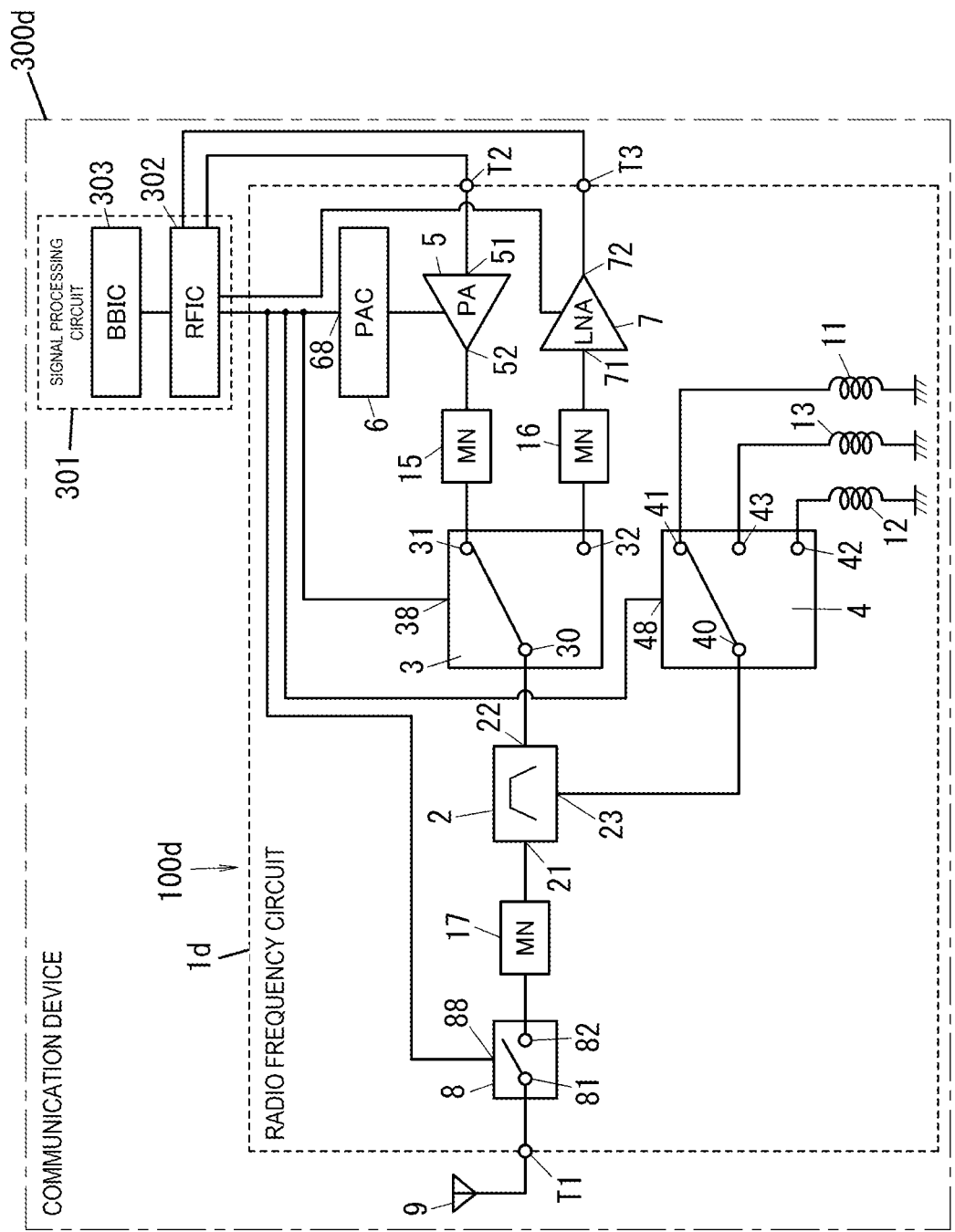
FIG. 8 is a circuit diagram of a communication device that includes a radio frequency circuit according to a third embodiment.
Figure 9:
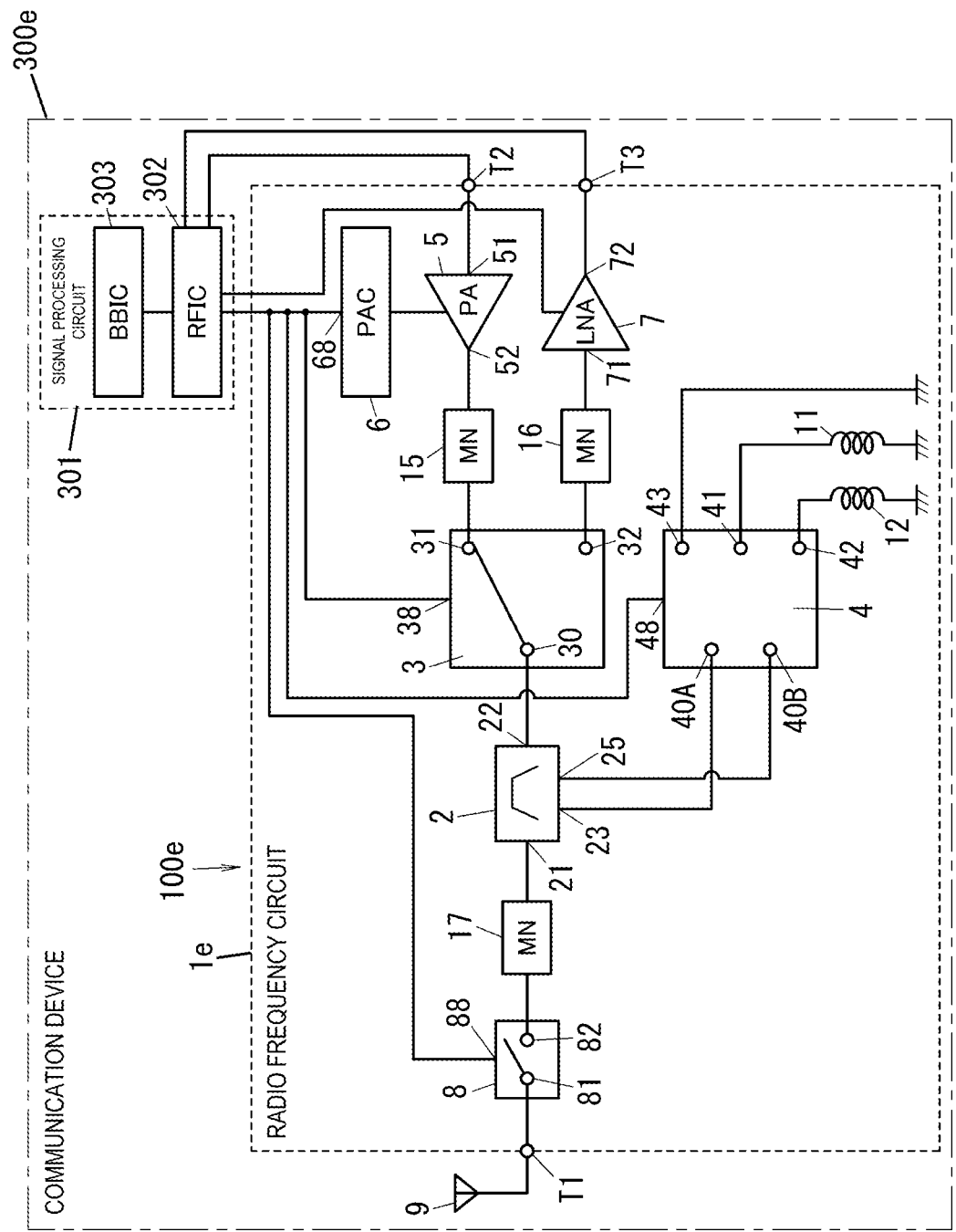
FIG. 9 is a circuit diagram of a communication device that includes a radio frequency circuit according to a fourth embodiment.

A radio frequency circuit 1d, a radio frequency module 100d, and a communication device 300d according to a third embodiment will now be described with reference to FIG. 8. Regarding the radio frequency circuit 1d, the radio frequency module 100d, and the communication device 300d according to the third embodiment, components like to those of the radio frequency circuit 1, the radio frequency module 100, and the communication device 300 according to the first embodiment are designated by like reference characters, and a description thereof is omitted.

Regarding TDD communication, the radio frequency circuit 1d can deal with the transmission of a transmission signal in a communication band compatible with a 4G (fourth generation mobile communication) standard and the reception of a reception signal in the communication band compatible with the 4G standard by using the single filter 2. The radio frequency circuit 1d can deal with the transmission of a transmission signal in a communication band compatible with a 5G (fifth generation mobile communication) standard and the reception of the reception signal in the communication band compatible with the 4G standard. Regarding TDD communication, the radio frequency circuit 1d can deal with the transmission of the transmission signal in the communication band compatible with the 4G standard and the reception of a reception signal in the communication band compatible with the 5G standard. The radio frequency circuit 1d can deal with the transmission of the transmission signal in the communication band compatible with the 5G standard and the reception of the reception signal in the communication band compatible with the 5G standard. Regarding TDD communication, the radio frequency circuit 1d can deal with the transmission of the transmission signal in the communication band compatible with the 4G standard and the transmission of the transmission signal in the communication band compatible with the 5G standard. Regarding TDD communication, the radio frequency circuit 1d can deal with the reception of the reception signal in the communication band compatible with the 4G standard and the reception of the reception signal in the communication band compatible with the 5G standard. An Example of the 4G standard is a 3GPP long term evolution (LTE) standard. An example of the 5G standard is a 5G new radio (NR). For example, the predetermined frequency band includes Band42 compatible with the 4G standard and n77 and n78 compatible with the 5G standard. A Band42 communication band ranges from 3400 MHz to 3600 MHz. A n77 communication band ranges from 3300 MHz to 4200 MHz. A n78 communication band ranges from 3300 MHz to 3800 MHz. The 4G standard and the 5G standard have different modulation methods and different modulation band widths. The modulation band width compatible with the 4G standard is, for example, 20 MHz. The modulation band width compatible with the 5G standard is, for example, 100 MHz. Accordingly, there is a possibility that the degree of a noise due to the power amplifier 5 during the transmission of the transmission signal compatible with the 5G standard is higher than that during the transmission of the transmission signal compatible with the 4G standard, and there is a possibility that neighborhood spurious emission cannot be achieved.

As for the radio frequency circuit 1d, the second switch 4 includes the second common terminal 40, the first selection terminal 41, the second selection terminal 42, and a third selection terminal 43. As for the radio frequency circuit 1d, the first selection terminal 41 of the second switch 4 is connected to the ground with a first reactive element 11 interposed therebetween, the second selection terminal 42 is connected to the ground with a second reactive element 12 interposed therebetween, and the third selection terminal 43 is connected to the ground with a third reactive element 13 interposed therebetween. The reactance value of the first reactive element 11, the reactance value of the second reactive element 12, and the reactance value of the third reactive element 13 differ from each other. The first reactive element 11, the second reactive element 12, and the third reactive element 13 are inductors that have different inductance values.

For example, regarding TDD communication, when the radio frequency circuit 1d transmits the transmission signal in the communication band compatible with the 4G standard and receives the reception signal in the communication band compatible with the 4G standard, in the case where the transmission signal compatible with the 4G standard is transmitted, the first common terminal 30 and the first terminal 31 are electrically connected to each other in the first switch 3, and the second common terminal 40 and the first selection terminal 41 are electrically connected to each other in the second switch 4. In the case where the radio frequency circuit 1d receives the reception signal compatible with the 4G standard, the first common terminal 30 and the second terminal 32 are electrically connected to each other in the first switch 3, and the second common terminal 40 and the second selection terminal 42 are electrically connected to each other in the second switch 4. Regarding TDD communication, when the radio frequency circuit 1d transmits the transmission signal in the communication band compatible with the 5G standard and receives the reception signal in the communication band compatible with the 5G standard, in the case where the transmission signal compatible with the 5G standard is transmitted, the first common terminal 30 and the first terminal 31 are electrically connected to each other in the first switch 3, and the second common terminal 40 and the third selection terminal 43 are electrically connected to each other in the second switch 4. In the case where the radio frequency circuit 1d receives the reception signal compatible with the 5G standard, the first common terminal 30 and the second terminal 32 are electrically connected to each other in the first switch 3, and the second common terminal 40 is electrically connected to the second selection terminal 42 and the third selection terminal 43 in the second switch 4. Regarding TDD communication, when the radio frequency circuit 1d transmits the transmission signal in the communication band compatible with the 4G standard and transmits the transmission signal in the communication band compatible with the 5G standard, in the case where the transmission signal compatible with the 4G standard is transmitted, the first common terminal 30 and the first terminal 31 are electrically connected to each other in the first switch 3, and the second common terminal 40 and the first selection terminal 41 are electrically connected to each other in the second switch 4. In the case where the radio frequency circuit 1d transmits the transmission signal compatible with the 5G standard, the first common terminal 30 and the first terminal 31 are electrically connected to each other in the first switch 3, and the second common terminal 40 is electrically connected to the first selection terminal 41 and the third selection terminal 43 in the second switch 4. Regarding TDD communication, when the radio frequency circuit 1d receives the reception signal in the communication band compatible with the 4G standard and receives the reception signal in the communication band compatible with the 5G standard, in the case where the reception signal compatible with the 4G standard is received, the first common terminal 30 and the second terminal 32 are electrically connected to each other in the first switch 3, and the second common terminal 40 and the second selection terminal 42 are electrically connected to each other in the second switch 4. In the case where the radio frequency circuit 1d receives the reception signal compatible with the 5G standard, the first common terminal 30 and the second terminal 32 are electrically connected to each other in the first switch 3, and the second common terminal 40 is electrically connected to the first selection terminal 41 and the second selection terminal 42 in the second switch 4.

As for the radio frequency circuit 1d, the reactance value of the first reactive element 11 and the reactance value of the second reactive element 12 are determined in advance such that the frequency of the attenuation pole in the filter characteristic of the filter 2 differs between the transmission of the transmission signal compatible with the 4G standard and the reception of the reception signal compatible with the 4G standard. As for the radio frequency circuit 1d, the reactance value of the first reactive element 11 and the reactance value of the second reactive element 12 are determined in advance such that the frequency of the attenuation pole in the filter characteristic during the transmission of the transmission signal compatible with the 4G standard is lower than the frequency of the attenuation pole in the filter characteristic during the reception of the reception signal compatible with the 4G standard. As for the radio frequency circuit 1d, in some cases, the frequency of the attenuation pole in the filter characteristic of the filter 2 differs between the transmission of the transmission signal compatible with the 4G standard and the reception of the reception signal compatible with the 5G standard, the frequency of the attenuation pole in the filter characteristic of the filter 2 differs between the transmission of the transmission signal compatible with the 5G standard and the reception of the reception signal compatible with the 4G standard, the frequency of the attenuation pole in the filter characteristic of the filter 2 differs between the transmission of the transmission signal compatible with the 5G standard and the reception of the reception signal compatible with the 5G standard, the frequency of the attenuation pole in the filter characteristic of the filter 2 differs between the transmission of the transmission signal compatible with the 4G standard and the transmission of the transmission signal compatible with the 5G standard, and the frequency of the attenuation pole in the filter characteristic of the filter 2 differs between the reception of the reception signal compatible with the 4G standard and the reception of the reception signal compatible with the 5G standard. Accordingly, the reactance value of the first reactive element 11, the reactance value of the second reactive element 12, and the reactance value of the third reactive element 13 may differ from each other to deal with these.

The radio frequency circuit 1d according to the third embodiment described above includes the filter 2, the first switch 3, and the second switch 4. The filter 2 includes the first input-output terminal 21, the second input-output terminal 22, and the ground terminal 23. The filter 2 allows the transmission signal in the predetermined frequency band to pass from the second input-output terminal 22 to the first input-output terminal 21 and allows the reception signal in the predetermined frequency band to pass from the first input-output terminal 21 to the second input-output terminal 22. The first switch 3 includes the first common terminal 30, the first terminal 31, and the second terminal 32. The first common terminal 30 is connected to the second input-output terminal 22. The first terminal 31 and the second terminal 32 are exclusively connectable to the first common terminal 30. The second switch 4 includes the second common terminal 40, the first selection terminal 41, and the second selection terminal 42. The second common terminal 40 is connected to the ground terminal 23. The first selection terminal 41 and the second selection terminal 42 are exclusively connected to the second common terminal 40. The first selection terminal 41 is connected to the ground with the first reactive element 11 interposed therebetween. The second selection terminal 42 is connected to the ground with the second reactive element 12 that has a reactance value that differs from the reactance value of the first reactive element 11 interposed therebetween. This enables the radio frequency circuit 1d according to the third embodiment to improve both of the filter characteristic during reception and the filter characteristic during transmission in the single filter 2. In short, in the case of TDD communication of the transmission signal in the communication band compatible with the 4G standard and the reception signal in the communication band compatible with the 4G standard, the radio frequency circuit 1d according to the third embodiment enables the frequency of the attenuation pole in the filter characteristic of the filter 2 during transmission to differ from the frequency of the attenuation pole in the filter characteristic of the filter 2 during reception.

The radio frequency module 100d according to the third embodiment includes the first reactive element 11 and the second reactive element 12 instead of the reactive element 10 of the radio frequency module 100 according to the first embodiment. The radio frequency module 100d according to the third embodiment can improve both of the filter characteristic during reception and the filter characteristic during transmission in the single filter 2 as in the radio frequency module 100 according to the first embodiment. The first reactive element 11 and the second reactive element 12 are inner-layer inductors that are disposed in the mounting substrate 101 but are not limited thereto and may be, for example, chip inductors that are mounted on the first main surface 111 of the mounting substrate 101. The first reactive element 11 or the second reactive element 12 may be an inner-layer inductor, and the other may be a chip inductor.

The communication device 300d according to the third embodiment includes the radio frequency circuit 1d and the signal processing circuit 301. This enables the communication device 300d to improve both of the filter characteristic during reception and the filter characteristic during transmission in the single filter 2.

The communication device 300d according to the third embodiment includes the radio frequency module 100d and the signal processing circuit 301. This enables the communication device 300d to improve both of the filter characteristic during reception and the filter characteristic during transmission in the single filter 2.

Fourth Embodiment

A radio frequency circuit 1e, a radio frequency module 100e, and a communication device 300e according to a fourth embodiment will now be described with reference to FIG. 9, FIG. 10A, FIG. 10B, and FIG. 10C. Regarding the radio frequency circuit 1e, the radio frequency module 100e, and the communication device 300e according to the fourth embodiment, components like to those of the radio frequency circuit 1d, the radio frequency module 100d, and the communication device 300d according to the third embodiment are designated by like reference characters, and a description thereof is omitted.

For example, regarding TDD communication, the radio frequency circuit 1e according to the fourth embodiment can deal with the transmission of the transmission signal in the communication band compatible with the 4G standard and the reception of the reception signal in the communication band compatible with the 4G standard by using the single filter 2 and can deal with the transmission of the transmission signal in the communication band compatible with the 5G standard.

As for the radio frequency circuit 1e according to the fourth embodiment, the second switch 4 includes two second common terminals 40A and 40B, the first selection terminal 41, the second selection terminal 42, and the third selection terminal 43. As for the radio frequency circuit 1e, the second common terminal 40A of the second switch 4 is connected to the first ground terminal 23 of the filter 2, and the second common terminal 40B is connected to the third ground terminal 25 of the filter 2. As for the radio frequency circuit 1e according to the fourth embodiment, the first selection terminal 41 is connected to the ground with the first reactive element 11 interposed therebetween, the second selection terminal 42 is connected to the ground with the second reactive element 12 interposed therebetween, and the third selection terminal 43 is directly connected to the ground.

The second switch 4 can connect one or more selection terminals of three selection terminals (the first selection terminal 41, the second selection terminal 42, and the third selection terminal 43) to the two second common terminals 40A and 40B. That is, the second switch 4 enables one-to-one connection and one-to-many connection regarding the two second common terminals 40A and 40B.

Figure 10A:
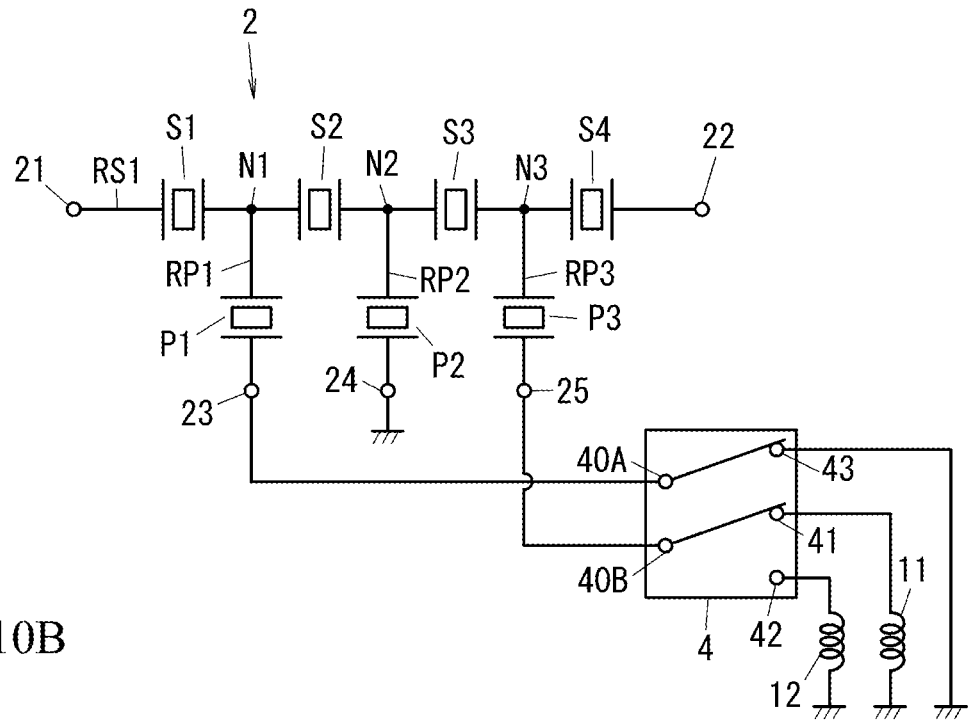
FIGS. 10A-10C illustrate states of a second switch of the radio frequency circuit.
Figure 10B:
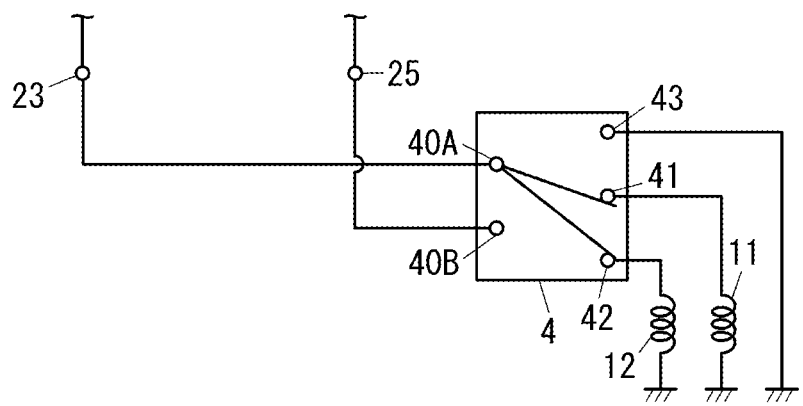
Figure 10C:
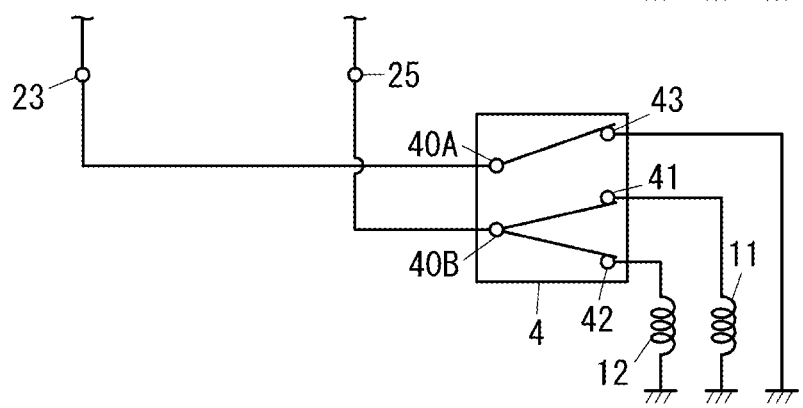

For example, in the cases where the radio frequency circuit 1e transmits the transmission signal compatible with the 4G standard, the first common terminal 30 and the first terminal 31 are electrically connected to each other in the first switch 3, and as illustrated in FIG. 10A, the second common terminal 40A and the third selection terminal 43 are electrically connected to each other, and the second common terminal 40B and the first selection terminal 41 are electrically connected to each other in the second switch 4. In the case where the radio frequency circuit 1e receives the reception signal compatible with the 4G standard, the first common terminal 30 and the second terminal 32 are electrically connected to each other in the first switch 3, and as illustrated in FIG. 10B, the second common terminal 40A is electrically connected to the first selection terminal 41 and the second selection terminal 42 in the second switch 4. In the case where the radio frequency circuit 1e transmits the transmission signal compatible with the 5G standard, the first common terminal 30 and the first terminal 31 are electrically connected to each other in the first switch 3, and as illustrated in FIG. 10C, the second common terminal 40A and the third selection terminal 43 are electrically connected to each other, and the second common terminal 40B is electrically connected to the first selection terminal 41 and the second selection terminal 42 in the second switch 4.

As for the radio frequency circuit 1e, the reactance value of the first reactive element 11 and the reactance value of the second reactive element 12 are determined in advance such that the frequency of the attenuation pole in the filter characteristic of the filter 2 differs between the transmission of the transmission signal and the reception of the reception signal, and the frequency of the attenuation pole in the filter characteristic of the filter 2 differs between the transmission of the transmission signal in the communication band compatible with the 4G standard and the transmission of the transmission signal in the communication band compatible with the 5G standard. As for the radio frequency circuit 1e, the reactance value of the first reactive element 11 and the reactance value of the second reactive element 12 are determined in advance such that the frequency of the attenuation pole in the filter characteristic during the transmission of the transmission signal is lower than the frequency of the attenuation pole in the filter characteristic during the reception of the reception signal.

The radio frequency circuit 1e according to the fourth embodiment can improve both of the filter characteristic during reception and the filter characteristic during transmission in the single filter 2. In the case of TDD communication of the transmission signal in the communication band compatible with the 4G standard and the reception signal in the communication band compatible with the 4G standard, the radio frequency circuit 1e according to the fourth embodiment enables the frequency of the attenuation pole in the filter characteristic of the filter 2 during transmission to differ from the frequency of the attenuation pole in the filter characteristic of the filter 2 during reception. The radio frequency circuit 1e according to the fourth embodiment enables the frequency of the attenuation pole in the filter characteristic of the filter 2 to differ between the transmission of the transmission signal in the communication band compatible with the 4G standard and the transmission of the transmission signal in the communication band compatible with the 5G standard.

The radio frequency module 100e according to the fourth embodiment can improve both of the filter characteristic during reception and the filter characteristic during transmission in the single filter 2 as in the radio frequency module 100d according to the third embodiment.

The communication device 300e according to the fourth embodiment includes the radio frequency circuit 1e and the signal processing circuit 301. This enables the communication device 300e to improve both of the filter characteristic during reception and the filter characteristic during transmission in the single filter 2.

The communication device 300e according to the fourth embodiment includes the radio frequency module 100e and the signal processing circuit 301. This enables the communication device 300e to improve both of the filter characteristic during reception and the filter characteristic during transmission in the single filter 2.

The embodiments described above correspond to embodiments that are included in various embodiments of the present disclosure. The embodiments described above can be modified in various ways depending on, for example, design, provided that the object of the present disclosure is achieved.

For example, the reactive element 10 is not limited to the inductor but may be, for example, a capacitor. The capacitor may be, for example, a variable capacitor such as a digitally tunable capacitor (DTC). That is, the reactive element 10 may be a variable reactive element.

As for the radio frequency circuit 1, the second common terminal 40 of the second switch 4 is connected to the ground terminal 23 of the filter 2 but is not limited thereto and may be connected to, for example, the ground terminal 25.

As for the radio frequency circuit 1, the second common terminal 40 may be connected to only the second selection terminal 42 during the transmission of the transmission signal, and the second common terminal 40 may be connected to only the first selection terminal 41 during the reception of the reception signal.

As for the radio frequency circuit 1, the first selection terminal 41 of the second switch 4 may be connected to the ground with the reactive element 10 interposed therebetween, and the second selection terminal 42 may be directly connected to the ground.

Figure 11:
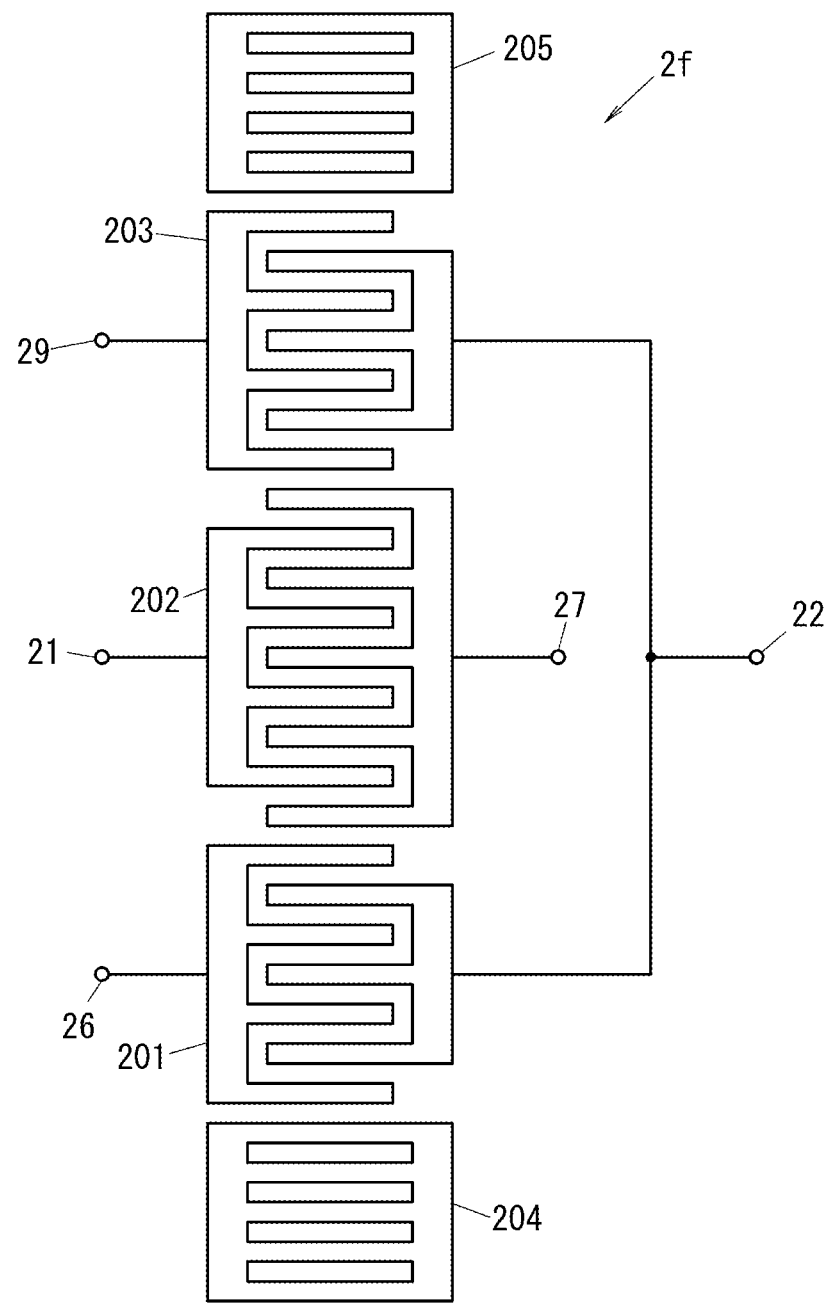
FIG. 11 illustrates a circuit according to a modification to the filter in the radio frequency circuit.

The filter 2 is not limited to the ladder filter. For example, the radio frequency circuit 1 may include a filter 2f illustrated in FIG. 11 instead of the filter 2. The filter 2f is a longitudinally coupled resonator-type surface acoustic wave filter and includes three IDT electrodes 201, 202, and 203 that are arranged in series and two reflectors 204 and 205 that are disposed at both ends in a direction in which the three IDT electrodes 201, 202, and 203 are arranged. The filter 2f includes the first input-output terminal 21, the second input-output terminal 22, three ground terminals 26, 27, and 29. In the case where the radio frequency circuit 1 includes the filter 2f, one of the three ground terminals 26, 27, and 29, for example, is connected to the second common terminal 40 of the second switch 4. The three IDT electrodes 201, 202, and 203 are arranged in a direction in which a surface acoustic wave propagates. The number of the IDT electrodes that are arranged between the two reflectors 204 and 205 in the longitudinally coupled resonator-type surface acoustic wave filter is not limited to three but may be, for example, five.

Figure 12:
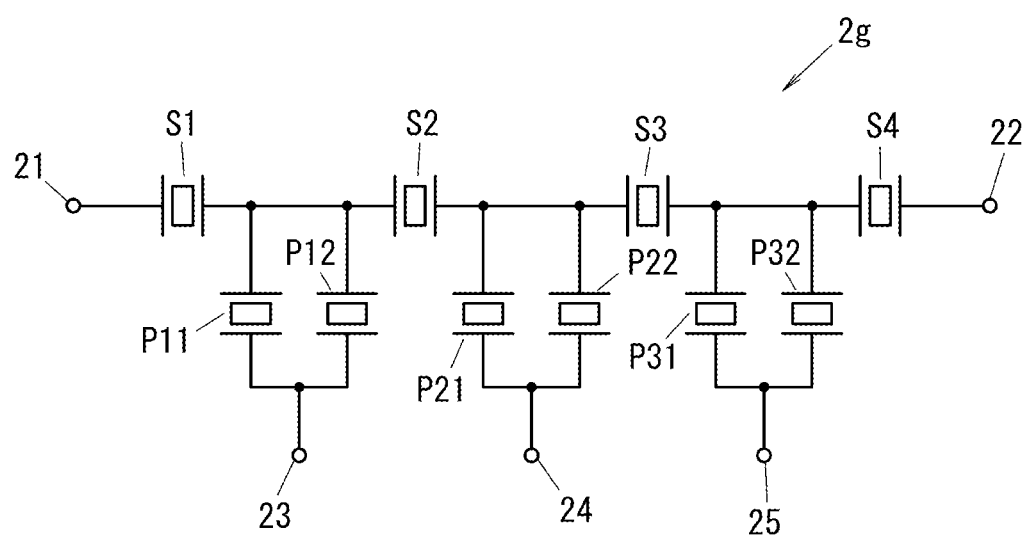
FIG. 12 illustrates a circuit according to a modification of the filter in the radio frequency circuit.

For example, the radio frequency circuit 1 may include a filter 2g illustrated in FIG. 12 instead of the filter 2 that has the structure illustrated in FIG. 2. The filter 2g includes a parallel circuit of two parallel arm resonators P11 and P12 instead of the first parallel arm resonator P1 of the filter 2, a parallel circuit of two parallel arm resonators P21 and P22 instead of the second parallel arm resonator P2, and a parallel circuit of two parallel arm resonators P31 and P32 instead of the third parallel arm resonator P3.

The radio frequency circuit 1 may be a radio-frequency front-end circuit that conforms to, for example, multi input multi output (MIMO). Accordingly, the third switch 8 is not limited to the SPST switch but may be, for example, a switch that includes a common terminal and multiple (for example, two) selection terminals that can be connected to the common terminal. In this case, for example, the common terminal can correspond to the first terminal 81, and one of the multiple selection terminals can correspond to the second terminal 82. In the case where the third switch 8 includes the multiple selection terminals, for example, the radio frequency circuit 1 may include multiple filters 2, and the multiple filters 2 may be connected to the multiple selection terminals in a one-to-one manner. In this case, the multiple filters 2 have different pass bands. A single filter that conforms to TDD may be connected to the selection terminals other than the second terminal 82 among the multiple selection terminals, a transmission filter that conforms to TDD may be connected thereto, a reception filter that conforms to TDD may be connected thereto, or another filter may be connected thereto.

The radio frequency circuit 1 may conform to carrier aggregation and dual connectivity. In the case where the radio frequency circuit 1 conforms to the carrier aggregation, the radio frequency circuit 1 can conform to the carrier aggregation in, for example, a combination of a high band of Band40 or a high band of Band41 and one or two of medium bands of Band1, Band3, Band2, Band25, Band4, Band66, Band39, and Band34.

The filter 2 described above is an acoustic wave filter that uses a surface acoustic wave but is not limited thereto and may be, for example, an acoustic wave filter that uses, for example, a boundary acoustic wave or a Lamb wave.

The filter 2 may be a LC filter. In the case where the filter 2 includes an acoustic wave filter, the attenuation characteristics in a band close to the pass band can be improved more than in the case where the filter 2 includes a LC filter. In the case where the filter 2 includes an acoustic wave filter, Γ (a reflection coefficient) in a medium band can be higher than that in the case where the filter 2 includes a LC filter.

The mounting substrate 101 is not limited to the printed circuit board or the LTCC substrate but may be, for example, a high temperature co-fired ceramics (HTCC) substrate or a component-containing substrate.

The first switch 3, the second switch 4, the third switch 8, and the low-noise amplifier 7 may include respective IC chips as in, for example, the radio frequency module 100 according to the first embodiment, or a freely selected combination thereof may be a one-chip.

Aspects

The present specification discloses aspects described below.

A radio frequency circuit (1, 1c, 1d, 1e) according to a first aspect includes a filter (2, 2f, 2g), a first switch (3), and a second switch (4). The filter (2, 2f, 2g) includes a first input-output terminal (21), a second input-output terminal (22), and a ground terminal (23). The filter (2, 2f, 2g) allows a transmission signal in a predetermined frequency band to pass from the second input-output terminal (22) to the first input-output terminal (21) and allows a reception signal in the predetermined frequency band to pass from the first input-output terminal (21) to the second input-output terminal (22). The first switch (3) includes a first common terminal (30), a first terminal (31), and a second terminal (32). The first common terminal (30) is connected to the second input-output terminal (22). The first terminal (31) and the second terminal (32) are exclusively connectable to the first common terminal (30). The second switch (4) includes a second common terminal (40), a first selection terminal (41), and a second selection terminal (42). The second common terminal (40) is connected to the ground terminal (23). The first selection terminal (41) and the second selection terminal (42) are exclusively or simultaneously connected to the second common terminal (40). Only the first selection terminal (41) or the second selection terminal (42) is connected to a ground with a reactive element (10) interposed therebetween, or the first selection terminal (41) is connected to the ground with a first reactive element (11) interposed therebetween, and the second selection terminal (42) is connected to the ground with a second reactive element (12) interposed therebetween. The reactance value of the second reactive element (12) differs from the reactance value of the first reactive element (11).

The radio frequency circuit (1, 1c, 1d, 1e) according to the first aspect can improve both of the filter characteristic during reception and the filter characteristic during transmission in the single filter (2, 2f, 2g).

As for a radio frequency circuit (1, 1c, 1d, 1e) according to a second aspect, when the connection state of the first switch (3) is changed, the connection state of the second switch (4) is changed depending on the changed connection state of the first switch (3) in the first aspect.

As for a radio frequency circuit (1) according to a third aspect, the second switch includes an input unit (48) in the first or second aspect. The connection state of the second switch (4) is changed based on a control signal that is inputted into the input unit (48) with the first common terminal (30) and the first terminal (31) being connected to each other in the first switch (3).

A radio frequency circuit (1, 1c, 1d, 1e) according to a fourth aspect further includes a power amplifier (5) that is connected to the first terminal (31) in any one of the first to third aspects.

A radio frequency circuit (1c) according to a fifth aspect further includes the power amplifier (5) and a power amplifier controller (6) in the third aspect. The power amplifier (5) is connected to the first terminal (31). The power amplifier controller (6) controls the power amplifier (5). The power amplifier controller (6) includes an input unit (68). The power amplifier controller (6) provides, to the second switch (4), a control signal for changing the connection state of the second switch (4), based on control information that is inputted into the input unit (68).

A radio frequency circuit (1, 1c, 1d, 1e) according to a sixth aspect further includes a low-noise amplifier (7) that is connected to the second terminal (32) in any one of the first to fifth aspects.

As for a radio frequency circuit (1, 1c) according to a seventh aspect, only the first selection terminal (41) or the second selection terminal (42) is connected to the ground with the reactive element (10) interposed therebetween, and the reactive element (10) is an inductor in any one of the first to sixth aspects.

The radio frequency circuit (1, 1c) according to the seventh aspect enables the frequency of the attenuation pole in the filter characteristic to differ between the case where the first selection terminal (41) is connected to the ground terminal (23) of the filter (2, 2f, 2g) and the case where the second selection terminal (42) is connected thereto. The radio frequency circuit (1, 1c) according to the seventh aspect enables the attenuation pole in the filter characteristic during transmission or the attenuation pole in the filter characteristic during reception to differ from the attenuation pole in the filter characteristic of the filter (2, 2f, 2g) itself.

As for a radio frequency circuit (1d) according to an eighth aspect, the first selection terminal (41) is connected to the ground with the first reactive element (11) interposed therebetween, the second selection terminal (42) is connected to the ground with the second reactive element (12) that has the reactance value that differs from the reactance value of the first reactive element (11) interposed therebetween, and the first reactive element (11) and the second reactive element (12) are inductors in any one of the first to sixth aspects.

The radio frequency circuit (1d) according to the eighth aspect enables the frequency of the attenuation pole in the filter characteristic to differ between the case where the first selection terminal (41) is connected to the ground terminal (23) of the filter (2, 2f, 2g) and the case where the second selection terminal (42) is connected thereto. The radio frequency circuit (1d) according to the eighth aspect enables the attenuation pole in the filter characteristic during transmission and the attenuation pole in the filter characteristic during reception to differ from the attenuation pole in the filter characteristic of the filter (2, 2f, 2g) itself.

A radio frequency module (100, 100a, 100b, 100c, 100d, 100e) according to a ninth aspect includes the filter (2, 2f, 2g), the first switch (3), the second switch (4), the power amplifier (5), the low-noise amplifier (7), and a mounting substrate (101). The filter (2, 2f, 2g) includes the first input-output terminal (21), the second input-output terminal (22), and the ground terminal (23). The filter (2, 2f, 2g) allows the transmission signal in the predetermined frequency band to pass from the second input-output terminal (22) to the first input-output terminal (21) and allows the reception signal in the predetermined frequency band to pass from the first input-output terminal (21) to the second input-output terminal (22). The first switch (3) includes the first common terminal (30), the first terminal (31), and the second terminal (32). The first common terminal (30) is connected to the second input-output terminal (22). The first terminal (31) and the second terminal (32) are exclusively connectable to the first common terminal (30). The second switch (4) includes the second common terminal (40), the first selection terminal (41), and the second selection terminal (42). The second common terminal (40) is connected to the ground terminal (23). The first selection terminal (41) and the second selection terminal (42) are exclusively or simultaneously connected to the second common terminal (40). The power amplifier (5) is connected to the first terminal (31). The low-noise amplifier (7) is connected to the second terminal (32). The mounting substrate (101) has a first main surface (111) and a second main surface (112) that face each other. As for the radio frequency module (100, 100a, 100b, 100c, 100d, 100e), only the first selection terminal (41) or the second selection terminal (42) is connected to the ground with the reactive element (10) interposed therebetween, or the first selection terminal (41) is connected to the ground with the first reactive element (11) interposed therebetween, and the second selection terminal (42) is connected to the ground with the second reactive element (12) that has the reactance value that differs from the reactance value of the first reactive element (11) interposed therebetween. The power amplifier (5) is mounted on the first main surface (111) of the mounting substrate (101). The low-noise amplifier (7), the first switch (3), and the second switch (4) are mounted on the second main surface (112) of the mounting substrate (101).

The radio frequency module (100, 100a, 100b, 100c, 100d, 100e) according to the ninth aspect can improve both of the filter characteristic during reception and the filter characteristic during transmission in the single filter (2, 2f, 2g).

As for a radio frequency module (100, 100a, 100b, 100c) according to a tenth aspect, only the first selection terminal (41) or the second selection terminal (42) is connected to the ground with the reactive element (10) interposed therebetween, and the reactive element (10) is an inductor in the ninth aspect.

The radio frequency module (100, 100a, 100b, 100c) according to the tenth aspect enables the frequency of the attenuation pole in the filter characteristic to differ between the case where the first selection terminal (41) is connected to the ground terminal (23) of the filter (2, 2f, 2g) and the case where the second selection terminal (42) is connected thereto.

As for a radio frequency module (100d) according to an eleventh aspect, the first selection terminal (41) is connected to the ground with the first reactive element (11) interposed therebetween, the second selection terminal (42) is connected to the ground with the second reactive element (12) that has the reactance value that differs from the reactance value of the first reactive element (11) interposed therebetween, and the first reactive element (11) and the second reactive element (12) are inductors in the ninth aspect.

The radio frequency module (100d) according to the eleventh aspect enables the frequency of the attenuation pole in the filter characteristic to differ between the case where the first selection terminal (41) is connected to the ground terminal (23) of the filter (2, 2f, 2g) and the case where the second selection terminal (42) is connected thereto.

A radio frequency module (100a, 100b) according to a twelfth aspect, a one-chip IC chip (19) that includes the low-noise amplifier (7), the first switch (3), and the second switch (4) is mounted on the second main surface (112) of the mounting substrate (101) in any one of the ninth to eleventh aspects.

The radio frequency module (100a, 100b) according to the twelfth aspect can decrease the size.

A communication device (300, 300c, 300d, 300e) according to a thirteenth aspect includes the radio frequency circuit (1, 1c, 1d, 1e) according to any one of the first to eighth aspects and a signal processing circuit (301) that performs a signal process on the transmission signal and the reception signal.

The communication device (300, 300c, 300d, 300e) according to the thirteenth aspect can improve both of the filter characteristic during reception and the filter characteristic during transmission in the single filter (2, 2f, 2g).

A communication device (300, 330c, 300d, 300e) according to a fourteenth aspect includes the radio frequency module (100, 100a, 100b, 100c, 100d, 100e) according to any one of the ninth to twelfth aspects and the signal processing circuit (301) that performs a signal process on the transmission signal and the reception signal.

The communication device (300, 330c, 300d, 300e) according to the fourteenth aspect can improve both of the filter characteristic during reception and the filter characteristic during transmission in the single filter (2, 2f, 2g).

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency circuit comprising:
   a filter that has a first input-output terminal, a second input-output terminal, and a ground terminal, that is configured to pass a transmission signal in a predetermined frequency band from the second input-output terminal to the first input-output terminal, and that is configured to pass a reception signal in the predetermined frequency band from the first input-output terminal to the second input-output terminal;
   a first switch that has a first common terminal that is connected to the second input-output terminal, a first terminal, and a second terminal, the first and second terminals being exclusively connectable to the first common terminal; and
   a second switch that has a second common terminal that is connected to the ground terminal, a first selection terminal, and a second selection terminal, the first and second selection terminals being exclusively connected to the second common terminal,
   wherein only the first selection terminal or the second selection terminal is connected to ground with a reactive element interposed therebetween, or
   wherein the first selection terminal is connected to ground with a first reactive element interposed therebetween, and the second selection terminal is connected to ground with a second reactive element interposed therebetween, the second reactive element having a reactance value that differs from a reactance value of the first reactive element.

2. The radio frequency circuit according to claim 1, wherein when a connection state of the first switch is changed, a connection state of the second switch is configured to change depending on the changed connection state of the first switch.

3. The radio frequency circuit according to claim 2, wherein the second switch has an input, and the connection state of the second switch is configured to change based on a control signal that is inputted into the input with the first common terminal and the first terminal being connected to each other in the first switch.

4. The radio frequency circuit according to claim 3, wherein the input comprises multiple terminals that conform to a mobile industry processor interface (MIPI) standard or a single terminal that conforms to a general purpose input/output (GPIO) standard.

5. The radio frequency circuit according to claim 1, further comprising:
a power amplifier that is connected to the first terminal.

6. The radio frequency circuit according to claim 3, further comprising:
a power amplifier that is connected to the first terminal; and
a power amplifier controller that is configured to control the power amplifier,
wherein the power amplifier controller comprises a second input, and
wherein the power amplifier controller provides a control signal to the second switch, the connection state of the second switch being configured to change based on the control signal, the control signal being based on control information that is inputted into the second input of the power amplifier controller.

7. The radio frequency circuit according to claim 6, wherein the second input comprises multiple terminals that conform to a mobile industry processor interface (MIPI) standard.

8. The radio frequency circuit according to claim 1, further comprising:
a low-noise amplifier that is connected to the second terminal.

9. The radio frequency circuit according to claim 1, wherein only the first selection terminal or the second selection terminal is connected to ground with the reactive element interposed therebetween, and the reactive element is an inductor.

10. The radio frequency circuit according to claim 1, wherein the first selection terminal is connected to ground with the first reactive element interposed therebetween, and the second selection terminal is connected to ground with the second reactive element interposed therebetween, and
wherein the first reactive element and the second reactive element are inductors.

11. A radio frequency module comprising:
a filter that has a first input-output terminal, a second input-output terminal, and a ground terminal, that is configured to pass a transmission signal in a predetermined frequency band from the second input-output terminal to the first input-output terminal, and that is configured to pass a reception signal in the predetermined frequency band to pass from the first input-output terminal to the second input-output terminal;
a first switch that has a first common terminal that is connected to the second input-output terminal, a first terminal, and a second terminal, the first and second terminals being exclusively connectable to the first common terminal; and
a second switch that has a second common terminal that is connected to the ground terminal, a first selection terminal, and a second selection terminal, the first and second selection terminals being exclusively or simultaneously connected to the second common terminal;
a power amplifier that is connected to the first terminal;
a low-noise amplifier that is connected to the second terminal; and
a mounting substrate that has a first main surface and a second main surface that face each other,
wherein only the first selection terminal or the second selection terminal is connected to ground with a reactive element interposed therebetween, or wherein the first selection terminal is connected to ground with a first reactive element interposed therebetween and the second selection terminal is connected to ground with a second reactive element interposed therebetween, the second reactive element having a reactance value that differs from a reactance value of the first reactive element,
wherein the power amplifier is mounted on the first main surface of the mounting substrate, and
wherein the low-noise amplifier, the first switch, and the second switch are mounted on the second main surface of the mounting substrate.

12. The radio frequency module according to claim 11, wherein only the first selection terminal or the second selection terminal is connected to ground with the reactive element interposed therebetween, and the reactive element is an inductor.

13. The radio frequency module according to claim 11, wherein the first selection terminal is connected to ground with the first reactive element interposed therebetween, and the second selection terminal is connected to ground with the second reactive element interposed therebetween, and
wherein the first reactive element and the second reactive element are inductors.

14. The radio frequency module according to claim 11, wherein a one-chip integrated circuit chip that comprises the low-noise amplifier, the first switch, and the second switch is mounted on the second main surface of the mounting substrate.

15. A communication device comprising:
the radio frequency circuit according to claim 1; and
a signal processing circuit that is configured to perform a signal process on the transmission signal and the reception signal.

16. A communication device comprising:
the radio frequency module according to claim 11; and
a signal processing circuit that is configured to perform a signal process on the transmission signal and the reception signal.

* * * * *